United States Patent
Mascolo et al.

(10) Patent No.: US 10,036,577 B2
(45) Date of Patent: Jul. 31, 2018

(54) PHOTOVOLTAIC MODULE MOUNTING AND INSTALLATION SYSTEM

(71) Applicant: David Ching, Union City, CA (US)

(72) Inventors: Gianluigi Mascolo, Milpitas, CA (US); Sam A. Cowley, Milpitas, CA (US); Jeffrey F. Boigenzahn, Milpitas, CA (US); Jonathan D. Albert, Milpitas, CA (US); Steven J. Coonen, Grass Valley, CA (US); Mehrdad M. Moslehi, Los Altos, CA (US); Michael Wingert, Milpitas, CA (US)

(73) Assignee: David Ching, Union City, CA (US)

( * ) Notice: Subject to any disclaimer, the term of this patent is extended or adjusted under 35 U.S.C. 154(b) by 0 days.

(21) Appl. No.: 15/231,768

(22) Filed: Aug. 8, 2016

(65) Prior Publication Data
US 2017/0133973 A1    May 11, 2017

Related U.S. Application Data

(60) Provisional application No. 62/202,749, filed on Aug. 7, 2015, provisional application No. 62/257,695, filed on Nov. 19, 2015, provisional application No. 62/301,978, filed on Mar. 1, 2016, provisional application No. 62/352,015, filed on Jun. 19, 2016.

(51) Int. Cl.
| | |
|---|---|
| *H02S 20/23* | (2014.01) |
| *F24J 2/52* | (2006.01) |
| *H01L 31/02* | (2006.01) |
| *H02S 30/10* | (2014.01) |
| *H02S 20/24* | (2014.01) |
| *H02S 40/36* | (2014.01) |

(52) U.S. Cl.
CPC .......... *F24J 2/5239* (2013.01); *F24J 2/5262* (2013.01); *H01L 31/02013* (2013.01); *H02S 20/24* (2014.12); *H02S 30/10* (2014.12); *H02S 40/36* (2014.12); *F24J 2002/5277* (2013.01)

(58) Field of Classification Search
CPC ................................ H02S 20/22; H02S 20/23
USPC ........................................................ 52/173.3
See application file for complete search history.

(56) References Cited

U.S. PATENT DOCUMENTS

| | | | |
|---|---|---|---|
| 8,505,248 B1 * | 8/2013 | Leong ..................... | F24J 2/5239 52/173.3 |
| 8,726,897 B2 * | 5/2014 | Wallgren ............... | F24J 2/4638 126/571 |
| 9,312,414 B2 * | 4/2016 | Ilzhoefer ................ | F24J 2/5233 |

(Continued)

*Primary Examiner* — Paola Agudelo
(74) *Attorney, Agent, or Firm* — Howard IP Law Group, PC

(57) ABSTRACT

A photovoltaic system comprises a photovoltaic module attached to a photovoltaic mount frame, the mount frame having a rectangular shape. A deflector is attached to the mount frame by a rotatable deflector and mount frame attachment wherein the deflector pivots around the rotatable deflector and mount frame attachment from a nesting position under the photovoltaic module in the mount frame to an installation position raising at least a first side of the mount frame. A mount foot is attached to the deflector by a rotatable mount foot and deflector attachment wherein the mount foot pivots around the rotatable mount foot and deflector attachment from a nesting position in a mount foot nesting indention in the deflector to an installation position planar to a mounting surface.

12 Claims, 24 Drawing Sheets

(56) References Cited

U.S. PATENT DOCUMENTS

| | | | | |
|---|---|---|---|---|
| 2010/0089390 A1* | 4/2010 | Miros | .................... | F24J 2/5239 |
| | | | | 126/608 |
| 2011/0132353 A1* | 6/2011 | Gumm | ................... | F24J 2/5233 |
| | | | | 126/680 |
| 2012/0186632 A1* | 7/2012 | Reinhold | ............... | F24J 2/4638 |
| | | | | 136/251 |
| 2012/0204935 A1* | 8/2012 | Meyer | ........................ | F24J 2/16 |
| | | | | 136/246 |
| 2013/0112248 A1* | 5/2013 | McPheeters | ............ | F16B 2/065 |
| | | | | 136/251 |
| 2013/0248467 A1* | 9/2013 | Wever | .................... | F24J 2/5211 |
| | | | | 211/41.1 |
| 2014/0069485 A1* | 3/2014 | Rawlings | .................. | F24J 2/52 |
| | | | | 136/251 |
| 2015/0059381 A1* | 3/2015 | Hoffmann | ............... | H02S 10/40 |
| | | | | 62/235.1 |
| 2015/0101996 A1* | 4/2015 | Nayar | .................... | H02S 20/23 |
| | | | | 211/41.1 |
| 2015/0236637 A1* | 8/2015 | Sade | ........................ | H02S 20/10 |
| | | | | 136/246 |
| 2015/0263669 A1* | 9/2015 | Youn | ........................ | H02S 40/12 |
| | | | | 320/101 |
| 2016/0118928 A1* | 4/2016 | Stephan | .................. | H02S 20/30 |
| | | | | 136/251 |
| 2016/0134231 A1* | 5/2016 | Wu | ......................... | H02S 30/10 |
| | | | | 136/251 |
| 2016/0218664 A1* | 7/2016 | Wehrli | ....................... | F24J 2/36 |
| 2016/0230394 A1* | 8/2016 | Secco | .................... | E04F 10/10 |

\* cited by examiner

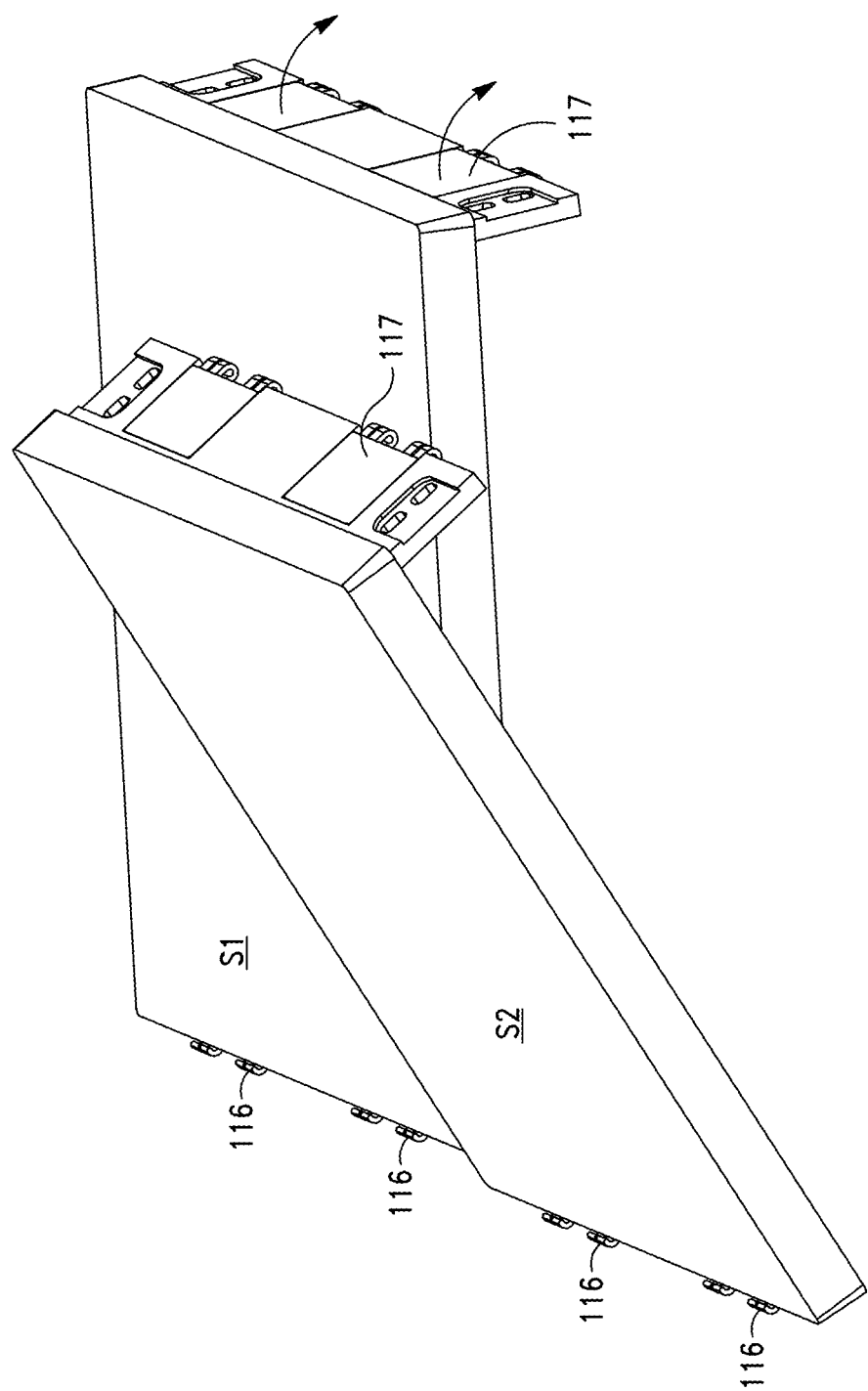

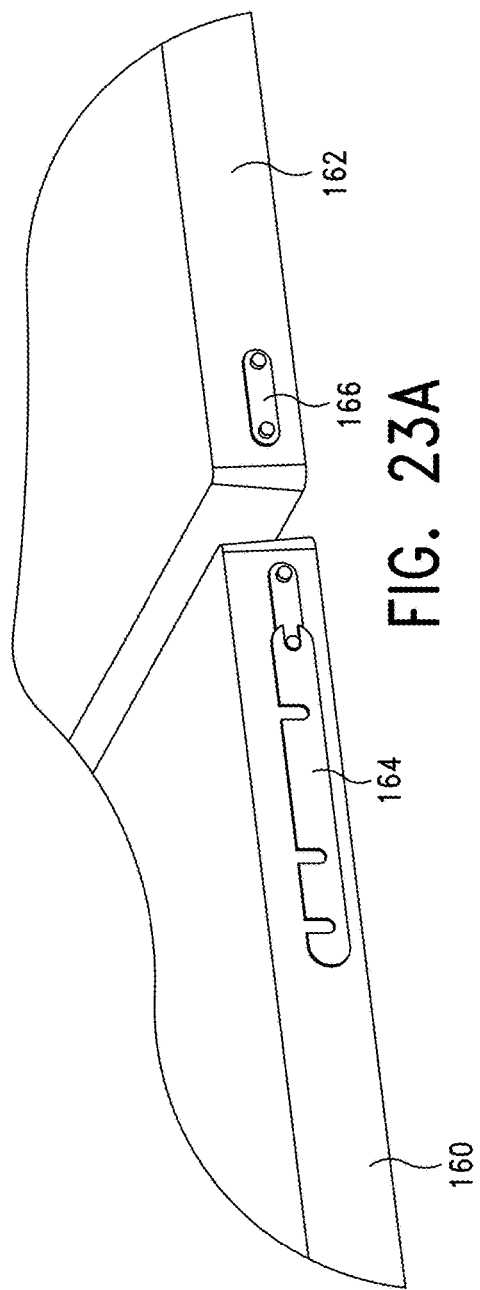
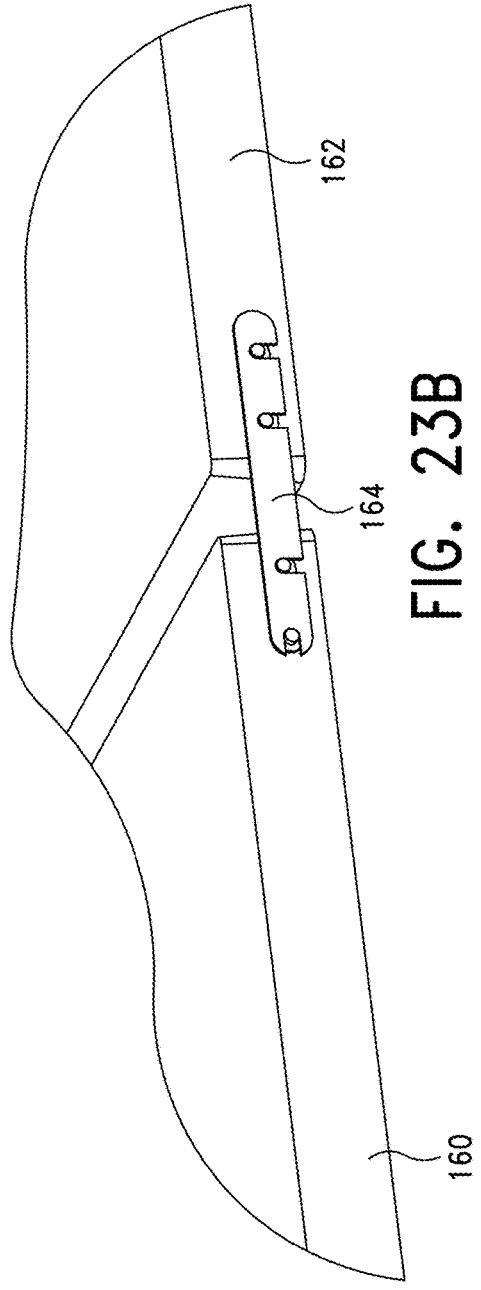

PHOTOVOLTAIC MODULE MOUNTING AND INSTALLATION SYSTEM

CROSS-REFERENCE TO RELATED APPLICATIONS

This application claims the benefit of U.S. provisional patent applications 62/202,749 filed on Aug. 7, 2015, 62/257,695 filed on Nov. 19, 2015, 62/201,978 filed on Mar. 1, 2016, and 62/352,015 filed on Jun. 19, 2016, all which are hereby incorporated by reference in their entirety.

FIELD OF THE INVENTION

The present disclosure relates in general to the fields of solar photovoltaics (PV), and more particularly to solar photovoltaics module and mount systems.

BACKGROUND

Requirements for solar photovoltaic (PV) module installations often include numerous challenging thresholds such as a minimum wind uplift resistance and a minimum snow load weight the installation will support. This has resulted in solar PV systems often requiring labor intensive and time consuming installation. For example, solar PV roof systems typically utilize roof penetration or a ballast to secure a solar module to the roof mounting structure. Roof penetration solar PV systems, for example, require roof penetration hardware materials and installation thus increasing system weight and installation time and labor. And ballast solar PV systems, for example, require the placement of heavy weighted objects, often cinder blocks, thus increasing system weight and installation time and labor.

BRIEF SUMMARY OF THE INVENTION

Therefore, a need has arisen for a PV system requiring reduced installation resources and having minimized mounting surface impact. In accordance with the disclosed subject matter, PV systems requiring reduced installation resources and having minimized mounting surface impact are provided which may substantially eliminate or reduces disadvantage and deficiencies associated with previously developed PV systems.

According to one aspect of the disclosed subject matter, a photovoltaic system is provided. The photovoltaic system comprises a photovoltaic module attached to a photovoltaic mount frame, the mount frame having a rectangular shape. A deflector is attached to the mount frame by a rotatable deflector and mount frame attachment wherein the deflector pivots around the rotatable deflector and mount frame attachment from a nesting position under the photovoltaic module in the mount frame to an installation position raising at least a first side of the mount frame. A mount foot is attached to the deflector by a rotatable mount foot and deflector attachment wherein the mount foot pivots around the rotatable mount foot and deflector attachment from a nesting position in a mount foot nesting indention in the deflector to an installation position planar to a mounting surface.

These and other aspects of the disclosed subject matter, as well as additional novel features, will be apparent from the description provided herein. The intent of this summary is not to be a comprehensive description of the claimed subject matter, but rather to provide a short overview of some of the subject matter's functionality. Other systems, methods, features and advantages here provided will become apparent to one with skill in the art upon examination of the following FIGUREs and detailed description. It is intended that all such additional systems, methods, features and advantages that are included within this description, be within the scope of any claims.

BRIEF DESCRIPTION OF THE DRAWINGS

The features, natures, and advantages of the disclosed subject matter may become more apparent from the detailed description set forth below when taken in conjunction with the drawings (dimensions, relative or otherwise not drawn to scale) in which like reference numerals indicate like features and wherein:

FIG. 11 is omitted;

FIGS. 16A through 16C are side perspective views of steps in the installation of a 2×2 array of PV systems in accordance with the disclosed subject matter;

FIGS. 23A and 23B are front perspective views of a two PV systems in a row.

DETAILED DESCRIPTION

Figure 1:
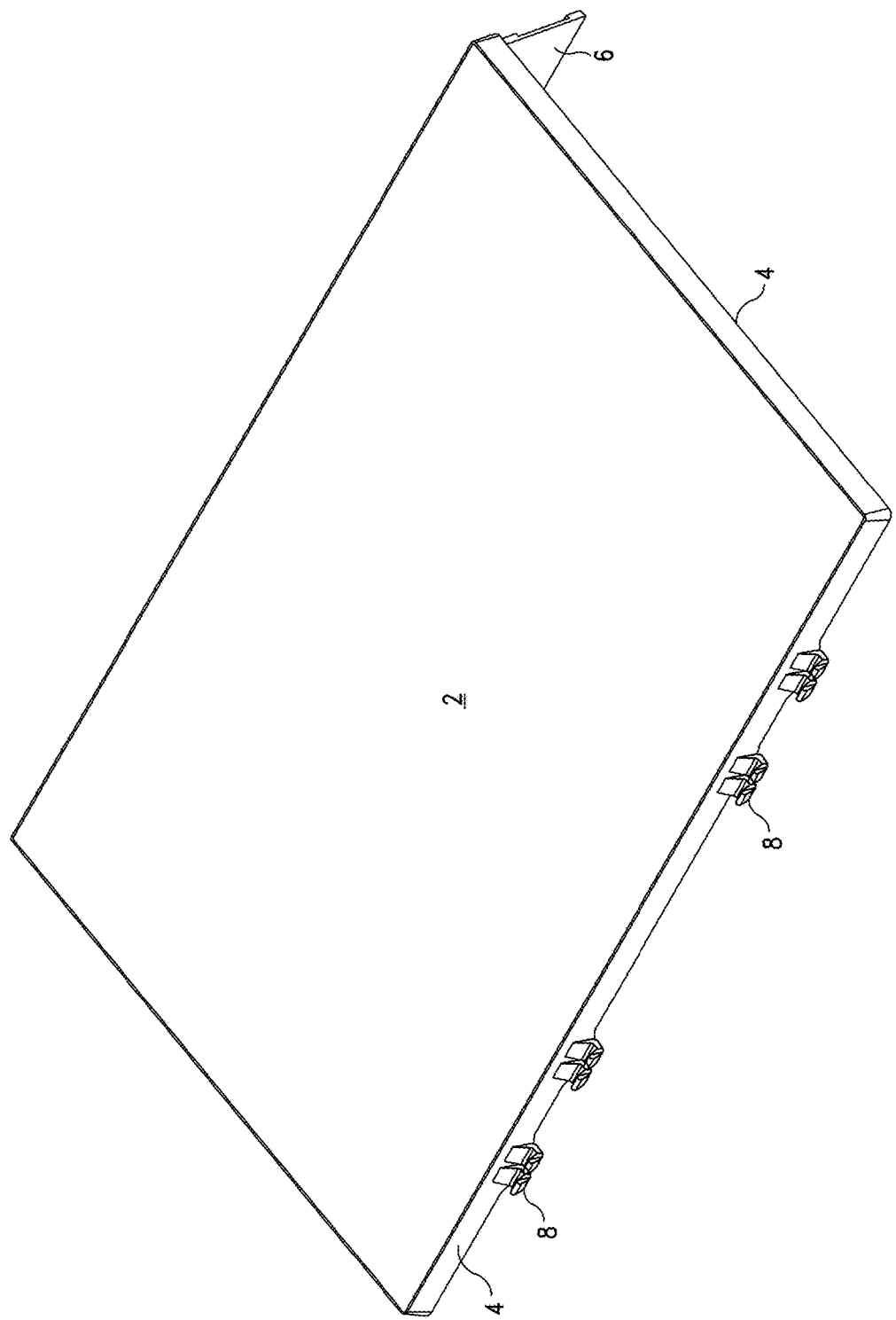
FIG. 1 is a front perspective view of a PV system in accordance with the disclosed subject matter.

The following description is not to be taken in a limiting sense, but is made for the purpose of describing the general principles of the present disclosure. The scope of the present disclosure should be determined with reference to the claims. Exemplary embodiments of the present disclosure are illustrated in the drawings, like aspects and identifiers being used to refer to like and corresponding parts of the various drawings.

And although the present disclosure is described with reference to specific embodiments, fabrication and installation processes, and materials, one skilled in the art could apply the principles discussed herein to other solar modules and mount structures, fabrication and installation processes, as well as alternative technical areas and/or embodiments without undue experimentation.

The comprehensive solution for PV module mounting and installation provided advantageously allows for reduced solar system weight, reduced installation time and complexity, increased packing density for shipping, self-aligning and interlocking PV system array installation, increased installed PV system array density, and minimized mounting surface impact through the elimination of mount surface penetration and weight for ballast while exceeding wind uplift resistance and snow load requirements. Many of these advantageous are particularly applicable to horizontal plane commercial rooftops, including those rooftops having strict weight restrictions, for flat roof solar array installation.

The PV module mount system provided is particularly designed for the use of lightweight materials, such as outdoor grade plastics and fiber-reinforced composite materials such as fiber reinforced plastics. Particularly advantageous PV module mount system materials include materials such as polymerics, polyolefins, and reinforced polymeric or polyolefin materials (e.g., reinforced by materials such as glass or carbon fibers), to enhance PV system weight reduction. Additionally, non-metal materials may eliminate or reduce PV mount grounding requirements. Materials such as polymeric materials, including composite glass or carbon filled polymeric materials and particularly including composite glass or carbon filled polyimide materials and composite glass or carbon filled polybutylene terephthalate (PBT) materials, are particularly advantageous for use as the mount frame, deflector, mount feet, and all other mount system structural aspects outside of the PV module. Additionally, to reduce fabrication costs, in consideration with other factors, the PV mount system may be formed by an injection molding, structural foam molding, compression molding, thermoforming, or three-dimensional printing fabrication process using these lightweight materials. Additional key fabrication advantages may include a symmetrical design for mirror parts fabrication of parts of a mount system structural aspect followed by attachment of the mirrored parts to complete the structural aspect.

A PV module, for example comprising electrically connected encapsulant (e.g., EVA) embedded solar cells, a cover material such as glass or plastic, and module back sheet as well as corresponding PV module wiring/cabling may be readily integrated with the disclosed PV module mount system before shipping to an installation location—thus, forming a comprehensive and integrated PV module and mount system with high density packing characteristics and improved ease of installation while reducing required installation resources such as labor and tools. PV system weight reduction may be further enhanced through lightweight PV module materials such as thin cover glass (e.g., cover glass having a thickness less than 2.5 mm).

FIG. 1 is a front perspective view of a PV system in accordance with the disclosed subject matter. Solar PV module 2 is attached to mount frame 4 having front attachments 8 shown as two pairs of two upwardly open facing hooks. Deflector 6 is attached to and raises the back of mount frame 4. The deflector supports the back of the mount frame to provide the desired PV system tilt. The PV module attached to the mount frame may have known PV module sizes and orientations, for example a 6×10 cell landscape orientation PV module.

Figure 2:
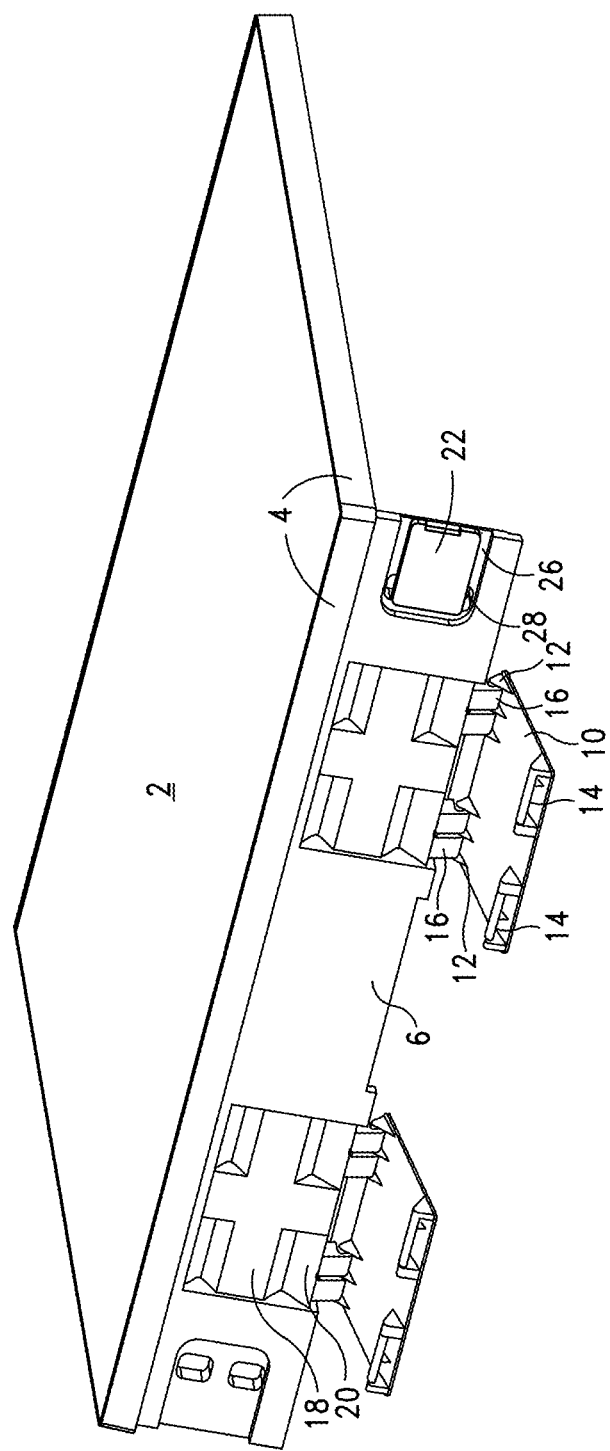
FIG. 2 is a rear perspective view of a PV system in accordance with the disclosed subject matter.

FIG. 2 is a rear perspective view of a PV system in accordance with the disclosed subject matter. Two back mount feet 10, each having two frontside hooking rods 12 and two backside hooking rods 14, are attached to deflector 6 by deflector bottom hooks 16 and frontside hooking rods 12. Two deflector mount feet nests 18, each including four mount feet hooking rod nests 20, are indentions in deflector 6 for the nesting of back mount feet 10. Side connector 22 is attached to deflector 6 at pivot attachment 24 in deflector side connector nests 26 having side connector grasp indentions 28. Deflector side connector nests 24 are indentions in deflector 6 for the nesting of side connector 22 and side connector grasp indentions 26 allow for the grasping and side connector 22. Mount frame 4 is flared from top to bottom such that the rectangular perimeter of the top of mount frame 4 is less than the rectangular perimeter of the bottom of mount frame 4. An advantage of a flared (or tapered from bottom to top) mount frame, particularly a flared mount frame on the same mount frame side as the deflector, is the flared mount frame may be used to align the deflector at an angle less than ninety degrees to the mounting surface (e.g., a roofing surface), in other words a sloped angle, to improve wind flow and wind uplift resistance. In an alternative embodiment, only the mount frame on the same mount frame side as the deflector is flared and the other sides are not (e.g., for example the other sides may be perpendicular). A sloped angle deflector may also improve PV system load bearing. Additionally, the internal surface of the mount frame on the deflector side may be used to create a strong locking and bracing mechanism for the deflectors allowing the deflector, and therefore the entire structure, to carry much higher vertical loads than a deflector mounted on the outside of the frame.

Mount feet nests in the deflector, for example, may be indentions in the thickness of the deflector to nest the mount feet structure or may be a conformal deflector design having a uniform deflector thickness such that the uniform deflector thickness is designed to nest the mount feet structure.

Figure 3:
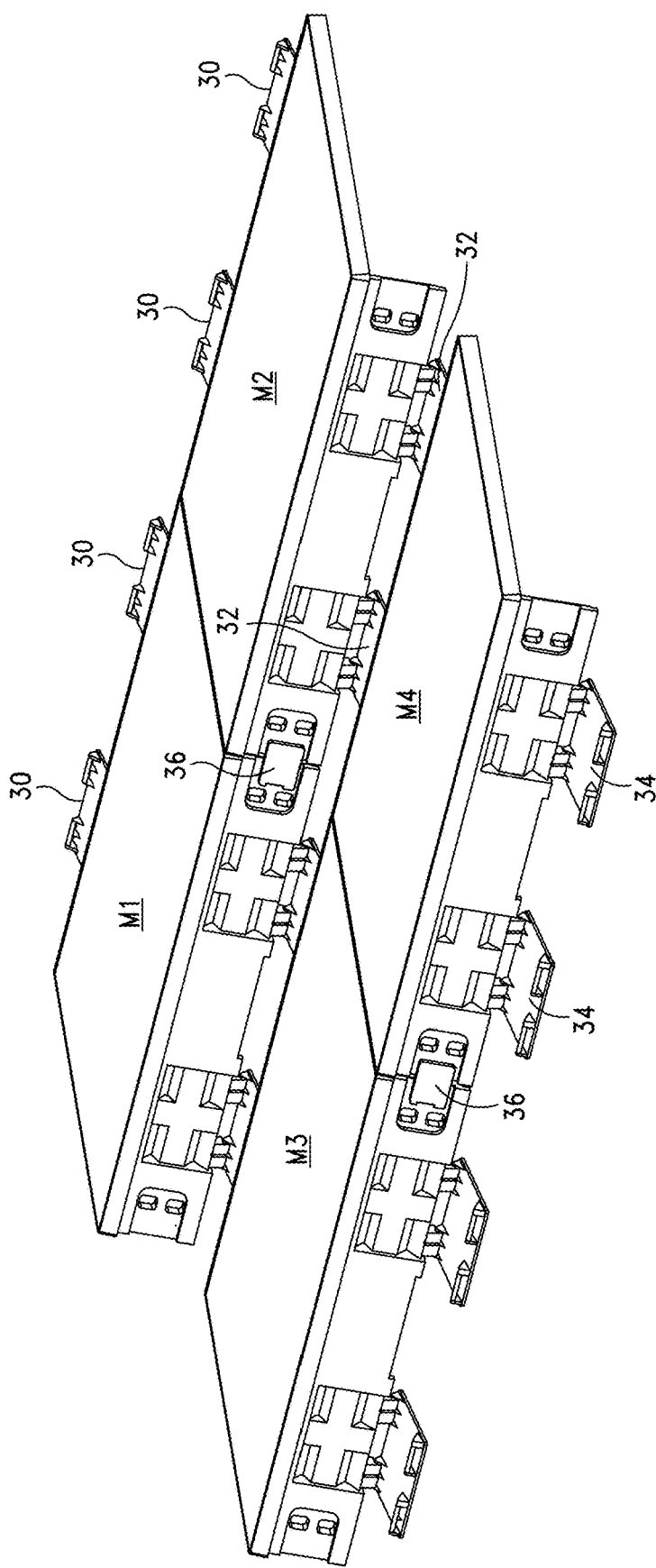
FIGS. 3 and 4 are rear and front perspective views, respectively, of a 2×2 array of installed PV systems of four PV systems.
Figure 4:
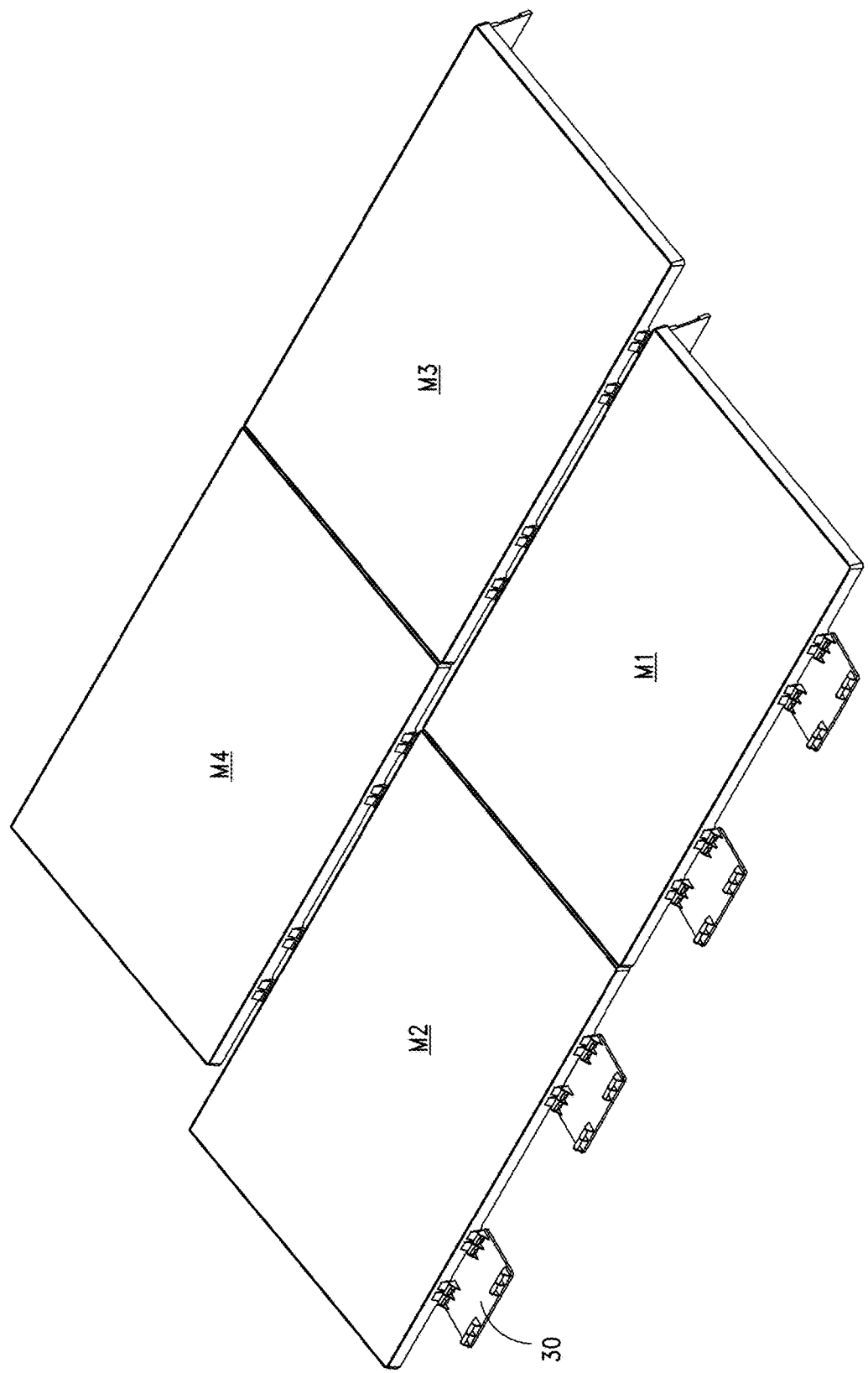

FIGS. 3 and 4 are rear and front perspective views, respectively, of a 2×2 array of installed PV systems of four PV systems of FIGS. 1 and 2. PV system M1 is attached to PV system M2 PV system M3 is attached to PV system M4 and using side connectors 36 (e.g., side connector 22 shown in FIG. 2). Side connectors 36 provide alignment of the side by side PV systems and interlock the side by side PV systems together. Spacing between side by side PV systems may be extremely small, for example in the range of millimeters, for high density PV system array installation. Feet 30, 32, and 36 are adhered (e.g., using double sided adhesive tape or glue) to a mounting surface. Feet 30 are attached to PV systems M1 and M2 (e.g., by a front mount frame attachment) to secure PV systems M1 and M2 to the mounting surface. Feet 32 are attached to PV systems M1 and M2 (e.g., by a rotatable back deflector connection) and are attached to PV systems M3 and M4 (e.g., by a front mount frame attachment) to secure PV systems M1 through M4 to the mounting surface and interlock PV systems M1 to M3 and M2 to M4. Feet 34 are attached to PV systems M3 and M4 (e.g., by a rotatable back deflector connection) to secure PV systems M3 and M4 to the mounting surface. Feet 30, 32, and 34 in combination with a front mount frame attachment provide alignment for the array and particularly the alignment of a column of PV systems (i.e., PV systems attached front to back), for example the array column made of PV systems M1 and M3. A row of PV systems, for example, is made of PV systems M1 and M2. Thus, the columns of the PV array of FIGS. 3 are 4 are self-aligning according to the design of the foot to front mount frame attachment. This self-alignment may be enhance by guiding ribs on the foot, for example guiding ribs aligning front mount attachment hooks into a rod attachment structure on the foot. Alternative attachment structures may include a pivot attachments and insertion sleeve attachments.

Figure 5:
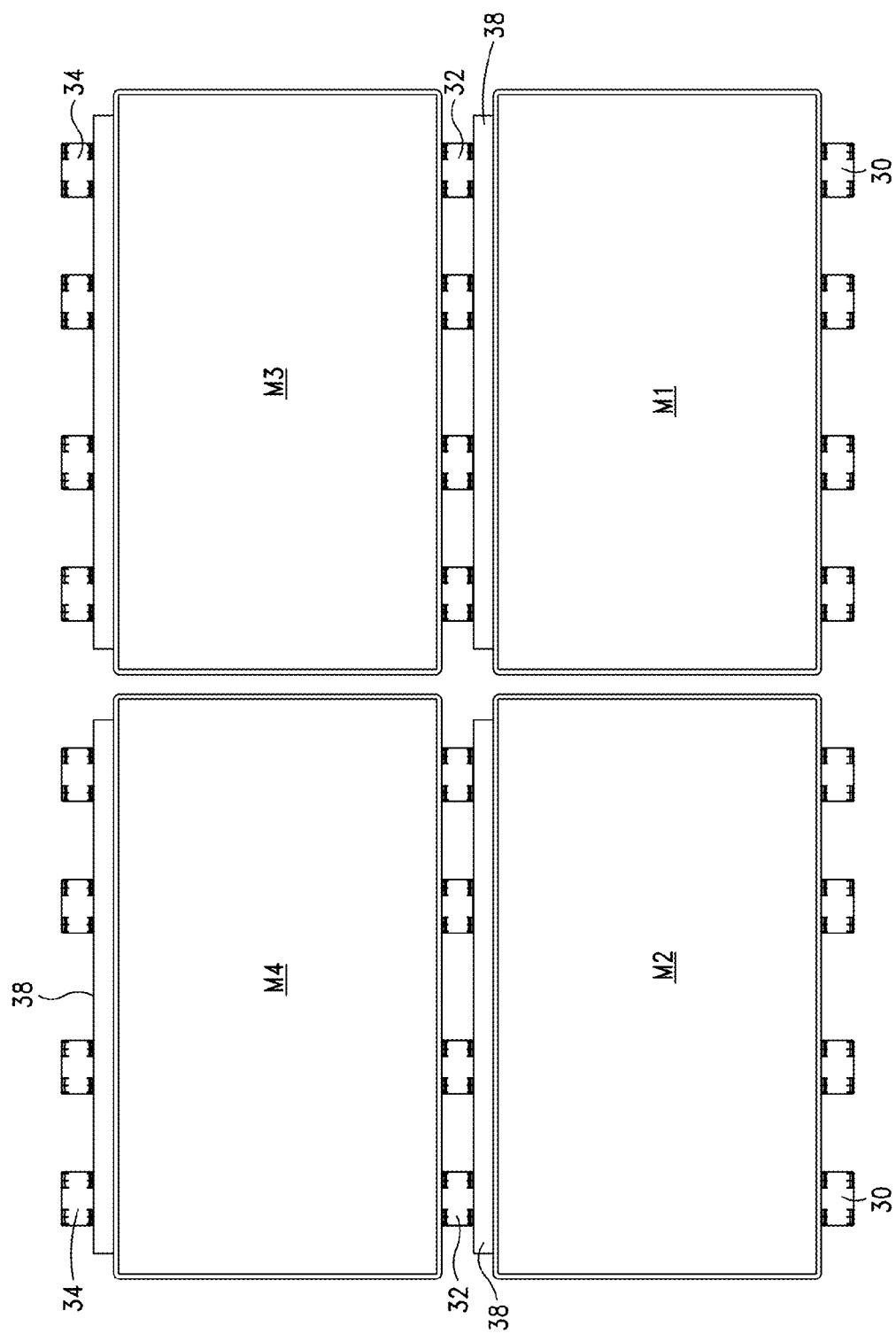
FIG. 5 is a top view of a 2×2 array of installed PV systems of four PV systems.
Figure 6:
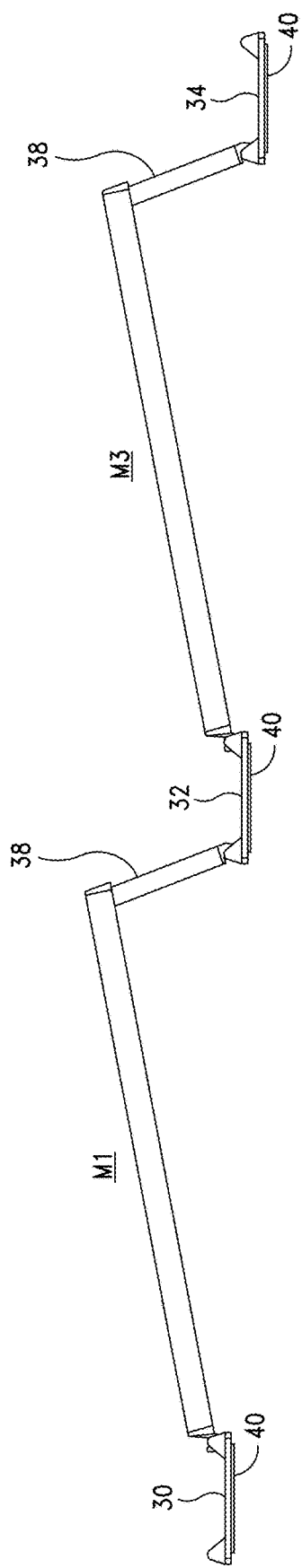
FIG. 6 is a side view of PV systems of FIG. 5.

FIG. 5 is a top view of a 2×2 array of installed PV systems of four PV systems. Deflector 38 raises PV systems M1 through M2. Details in the deflector, such as those shown in deflector 6 of FIGS. 1 through 4, have been omitted for drawing clarity. FIG. 6 is a side view of PV systems M1 and M3 in FIG. 5. Adhesive 40 on the bottom of feet 30, 32, and 34 adheres the mount feet to a mounting surface.

Figure 7:
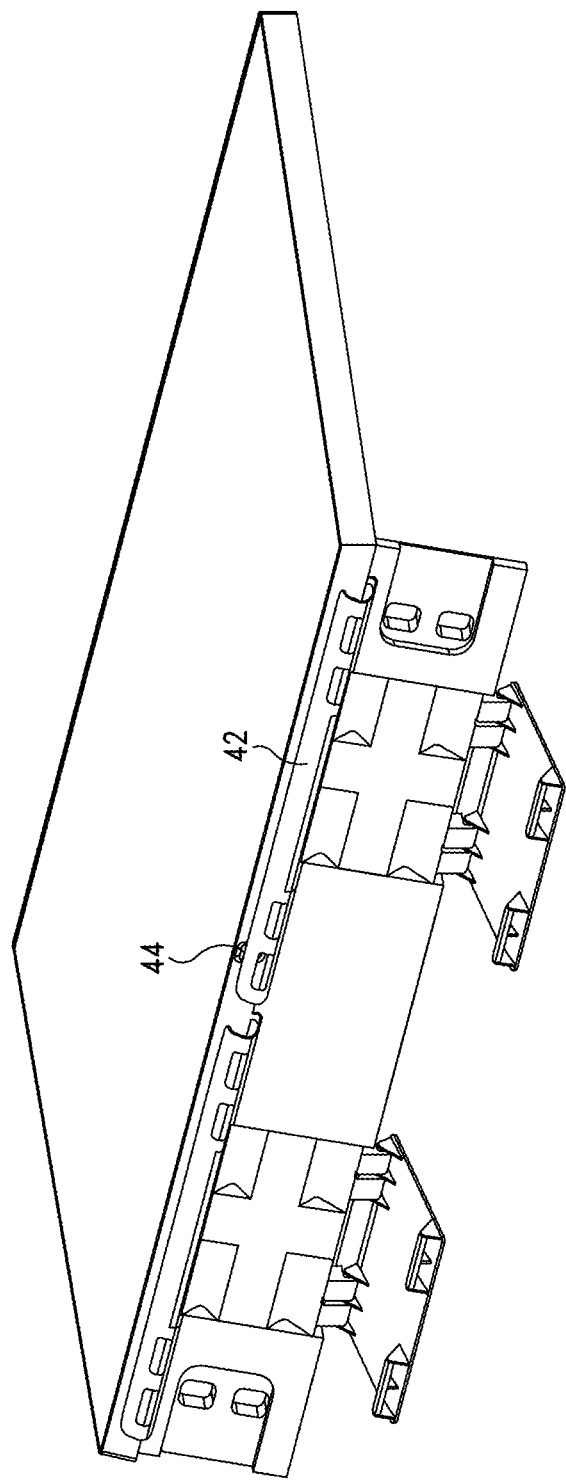
FIG. 7 is a rear perspective view of a PV system.

FIG. 7 is a rear perspective view of the PV system of FIG. 2 with cable guard 42 attached to the mount frame and cable hole 44 in the mount frame for PV module wire management. Wires and cabling associated with the PV module attached to the mount frame may be routed through cable hole 44 and transferred along cable guard 42 for electrical connection to adjacent PV systems. Cable hole 44 provides an access hole for PV module wires/cables and cable guard 42 provides wire guidance to an adjacent PV system for electrical connection. The integrated PV module and PV module mount system of the present disclosure may be shipped with PV module wires/cables stored below the PV module in the mount frame and during installation (e.g., before securing the PV system to the mounting surface) the module wires/cables may be pulled through the access hole and the cable guard (e.g., with external wire connections positioned on either end of the cable guard for connection to adjacent PV systems), thus providing improved PV module wire management and PV system installation ease such that after attaching a PV system to a mounting surface adjacent PV systems may be readily electrically connected. Alternatively, the PV system may be shipped with the module wires/cables be pulled through the access hole and the cable guard such that the cable guard provides wire/cable protection during shipping.

Figure 8A:
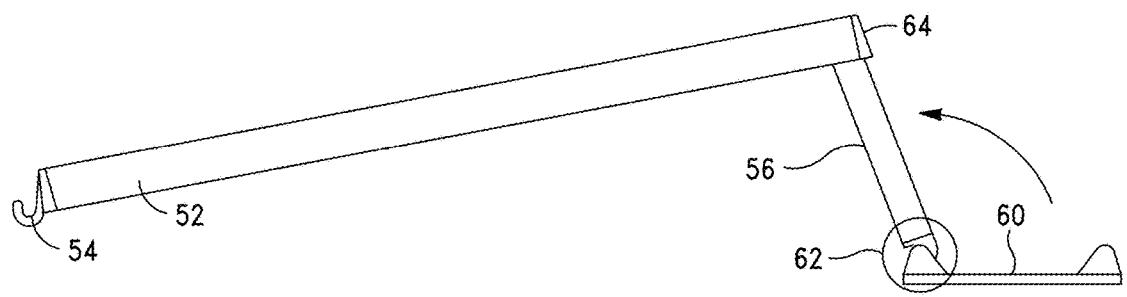
FIGS. 8A through 8C are side views of an attached deflector and mount foot.
Figure 8B:
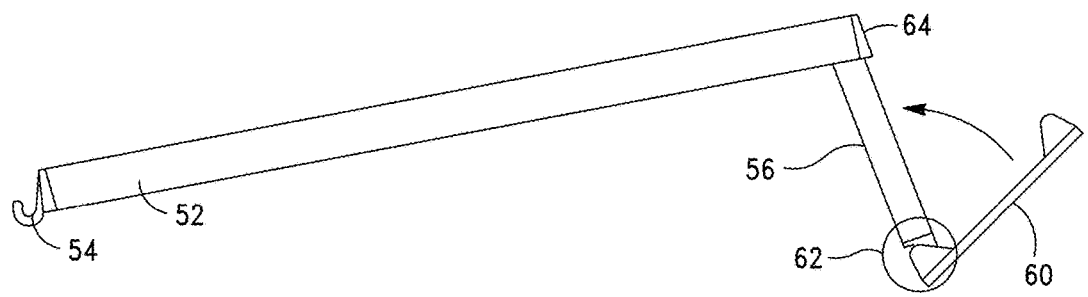
Figure 8C:
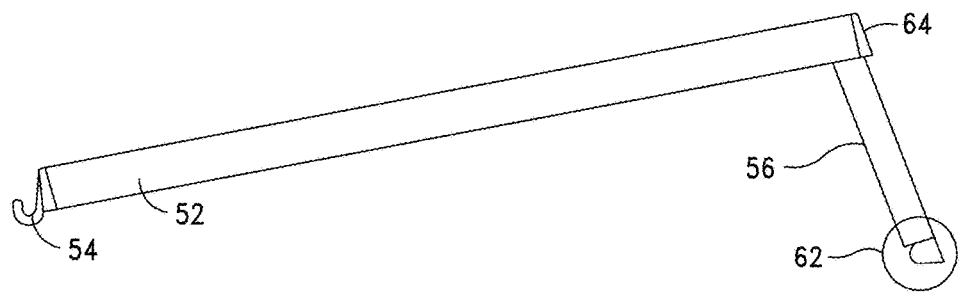

FIGS. 8A through 8C are side views of an attached deflector and mount foot showing mount foot 60 pivoting around rotatable attachment 62 of deflector 56 to mount foot 60. Deflector 56 is attached to mount frame 52 and is aligned respective to the mount surface at the same angle as the flared sidewall 64 of mount frame 52 for installation (referred to as deflector installation position). Note that although shown with a ledge between flared sidewall 64 and deflector 56, the deflector, and mount frame, and deflector and mount frame attachment may be structured and designed to minimize this ledge such that exterior surfaces of flared sidewall 64 and deflector 56 are substantially planar for improved wind uplift resistance. Mount frame has front attachment hooks 54 (e.g., for attachment to a mount foot). FIG. 8A shows mount foot 60 in installation position, in other words planar to a mounting surface, for adhesion to a mounting surface. FIG. 8B shows mount foot 60 in partial rotation pivoting around rotatable attachment 62 for nesting into deflector 56. FIG. 8C shows mount foot 60 in PV system shipping position with mount foot 60 completely nested into deflector 56 (i.e., mount foot 60 nested into a deflector nest in deflector 56)—note mount foot 60 is not visible in nested position from the side view of FIG. 8C.

Figure 9C:
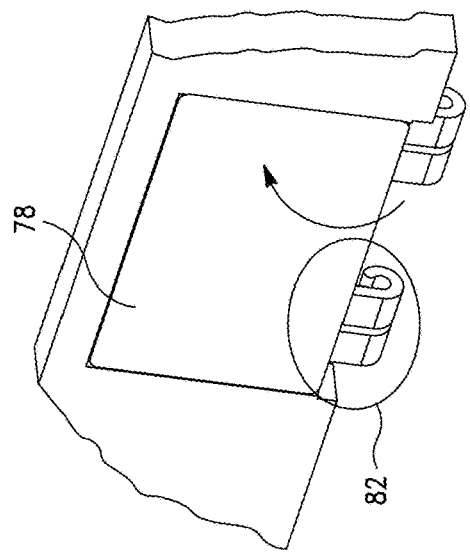
FIGS. 9A through 9C are views showing a rotatable hook and rod deflector and mount foot attachment.
Figure 9B:
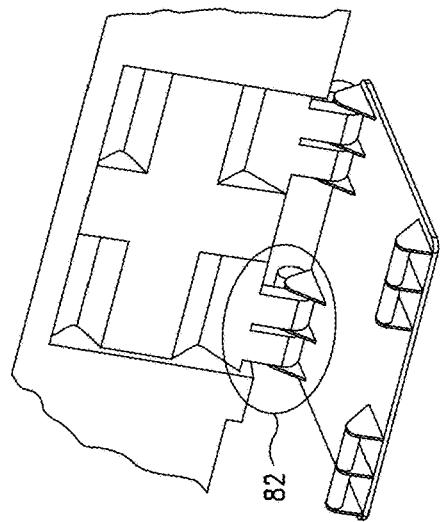
Figure 9A:
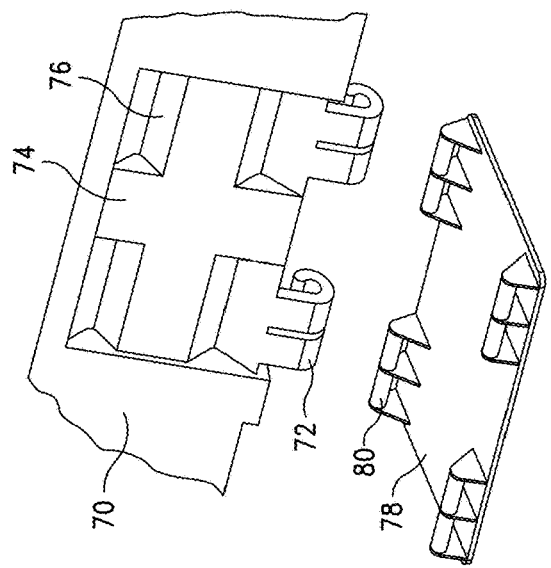

FIGS. 9A through 9C are views showing a rotatable hook and rod deflector and mount foot attachment. Deflector 70 has mount foot nest 74, including mount rod nest 76, conforming to the shape of mount foot 78 and mount foot attachment rods 80. Deflector bottom hooks 72 are positioned at the bottom of the deflector for attachment to mount foot attachment rods 80. FIG. 9A shows deflector 70 and mount foot 78 unattached. The attachment of deflector bottom hooks 72 and mount foot attachment rods 80 forms rotatable deflector and mount attachment 82. FIG. 9B shows deflector 70 and mount foot 78 attached as rotatable deflector and mount attachment 82 with mount foot 78 in installation position. Mount foot 78 may pivot around rotatable deflector and mount attachment 82 back and forth from installation position to a nested position such that mount foot 78 and mount foot attachment rods 80 nest in mount foot nest 74 and mount rod nest 76 and the bottom of mount foot 78 forms a planar surface with deflector 70. FIG. 9C shows deflector 70 and mount foot 78 attached as rotatable deflector and mount attachment 82 with mount foot 78 in nesting position with a planar surface formed of the bottom of mount foot 78 and deflector 70. In other words, mount foot 78 pivots around rotatable deflector and mount attachment 82 from installation position (installation position shown in FIG. 9B) to nesting position (nesting position shown in FIG. 9C) and vice versa.

Figure 10A:
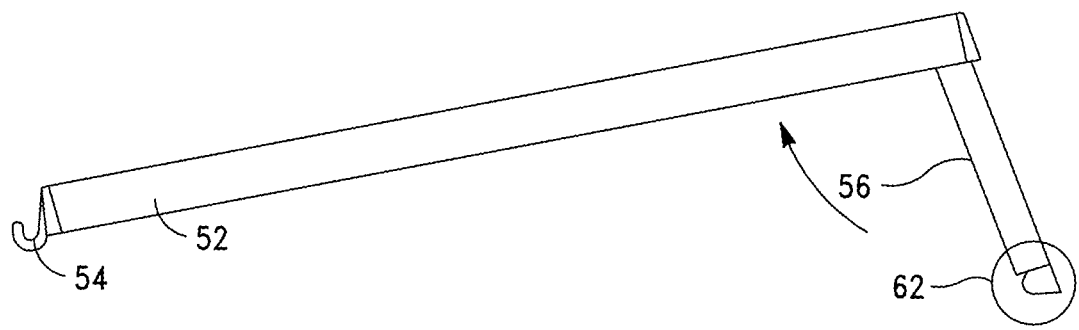
FIGS. 10A through 10C are side views of an attached deflector and mount frame.
Figure 10B:
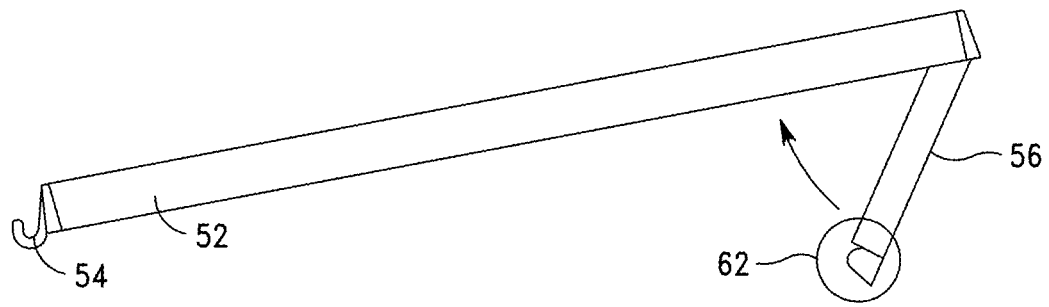
Figure 10C:
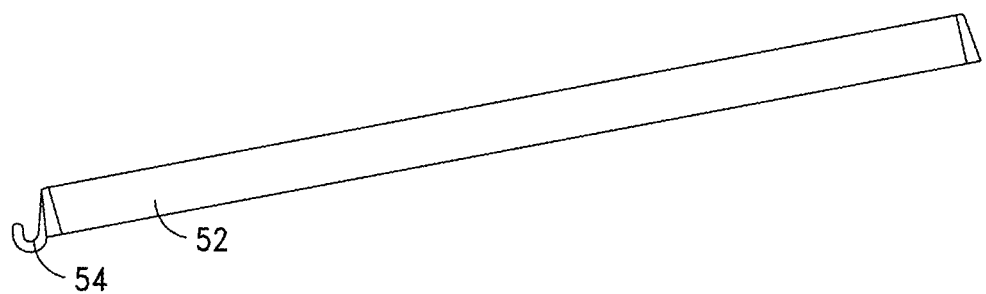

FIGS. 10A through 10C are side views of an attached deflector and mount frame showing deflector 56 pivoting around a rotatable attachment inside mount frame 54. The structure of FIGS. 10A through 10C is consistent with the structure of FIGS. 8A through 8C. Deflector 56 is attached to mount frame 52 and is aligned respective to the mount surface at the same angle as the flared sidewall 64 of mount frame 52 for installation (referred to as deflector installation position). Mount frame has front attachment hooks 54 (e.g., for attachment to a mount foot). FIG. 10A shows deflector 56 in installation position consistent with FIG. 8C. FIG. 10B shows deflector 56 in partial rotation pivoting around a rotatable attachment inside mount frame 54 for nesting into mount frame 54. FIG. 10C shows deflector 56 PV system in shipping position with deflector 56 completely nested in mount frame 54 (i.e., deflector 56 nested under a PV module, and under corresponding PV module attachment surfaces such as an internal ledge and ribs, inside mount frame 54)—note deflector 56 is not visible in nested position from the side view of FIG. 10C.

Figure 12:
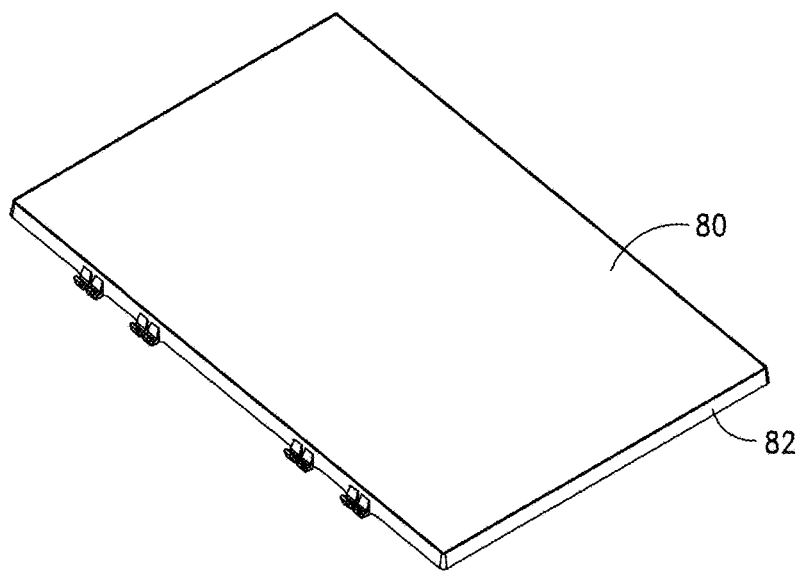
FIG. 12 is a front perspective view of PV system.
Figure 13:
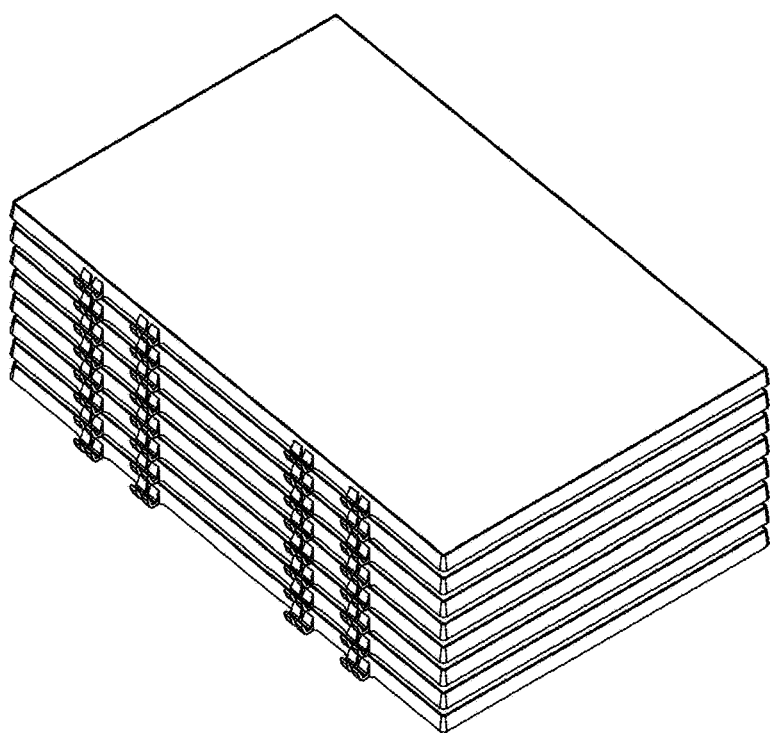
FIG. 13 is a front perspective of a stack of PV systems.

FIG. 12 is a front perspective view of PV system, for example having a structure consistent with the PV system of FIGS. 1 and 2, in shipping position with a deflector in nested position under PV module 80 which is attached to mount frame 82. Note the lip of the sidewalls of mount frame 82 exposed above PV module 80. Exposed mount frame sidewall lip may be advantageous for protecting PV module 80 when stacking the PV systems of FIG. 12 (e.g., the exposed lip of an underneath PV system in a stack of PV systems provides a set-off from the stacked PV system above such that there is nothing touching the PV module of the underneath PV system). Alternatively, the mount frame may be designed such that the PV module may be attached flush with the sidewalls of the mount frame resulting in an unexposed sidewall lip. FIG. 13 is a front perspective of a stack of the PV system of FIG. 12. In shipping position, with a rear deflector nested inside the frame, the PV system disclosed herein provides extremely high PV system shipping density.

Figure 14A:
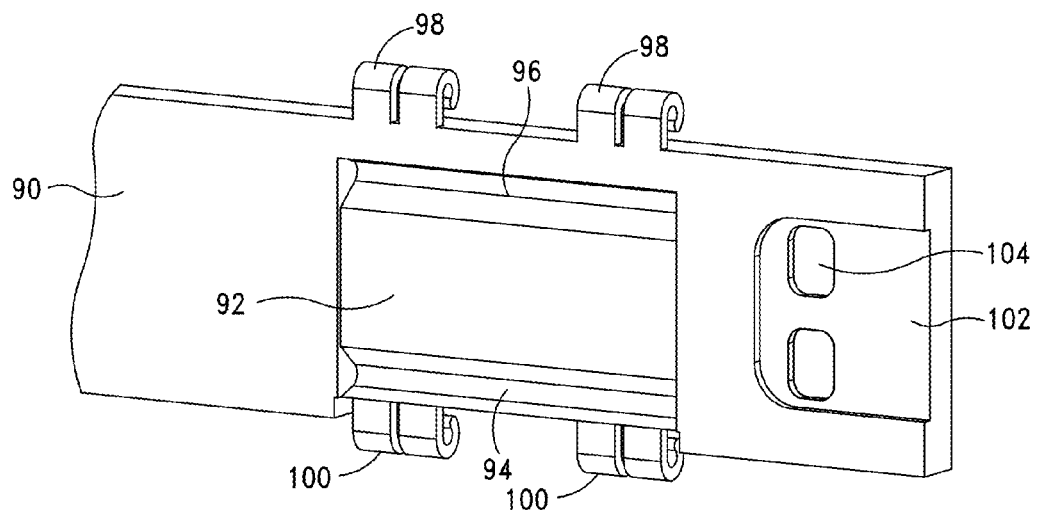
FIGS. 14A through 14D are views showing a rotatable hook and rod mount frame and deflector attachment.
Figure 14B:
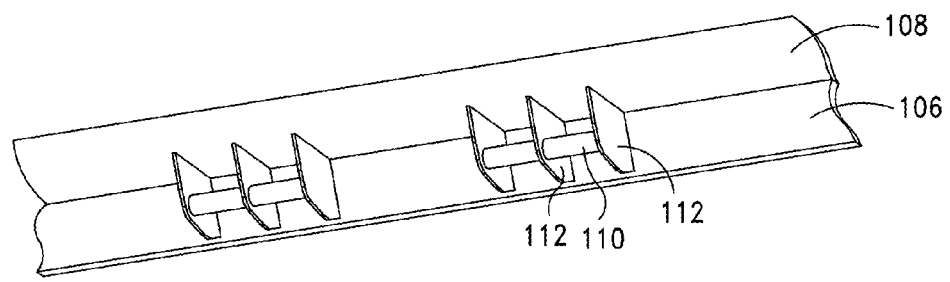

FIGS. 14A through 14D are views showing a rotatable hook and rod mount frame and deflector attachment. FIG. 14A is a rear perspective view of deflector 90 having deflector top hooks 98 and deflector bottom hooks 100. Mount foot nest 92 includes top mount foot attachment nest 96 and bottom mount foot attachment nest 94 (e.g., conformal mount foot attachment nests for an alternative design of the mount foot attachment rod of FIG. 9). Side connection indention 102 and side connector grasp indentions 104 are primarily shown here for orientation context of the deflector throughout FIGS. 14A through 14D. FIG. 14B shows a bottom up perspective of a mount frame having flared side wall 106 and internal ledge 108. Mount frame attachment rods 110 are supported by attachment rod support ribs 112 connected to the internal surface of flared side wall 106 and the bottom surface of internal ledge 108. In other words, the PV module is attached to the opposite side of internal ledge 108 and mount frame attachment rods 110 and attachment rod support ribs 112 are positioned under the PV module and separate from the PV module by internal ledge 108.

Figure 14C:
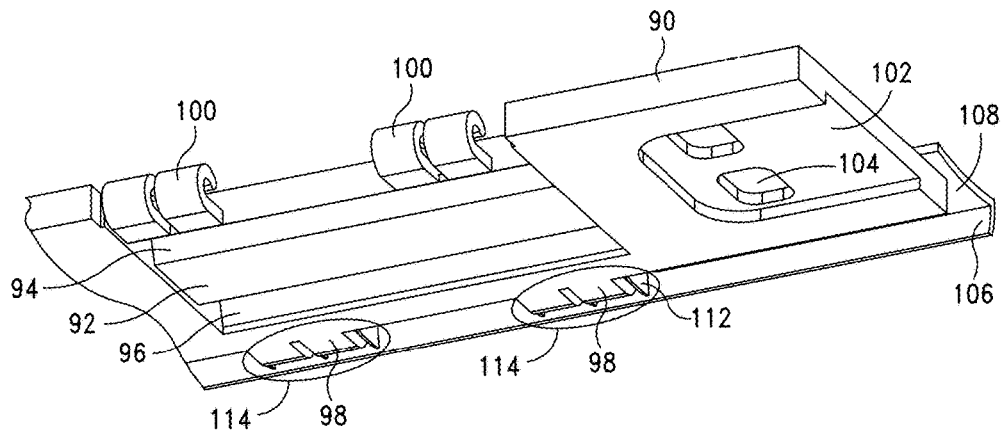
Figure 14D:
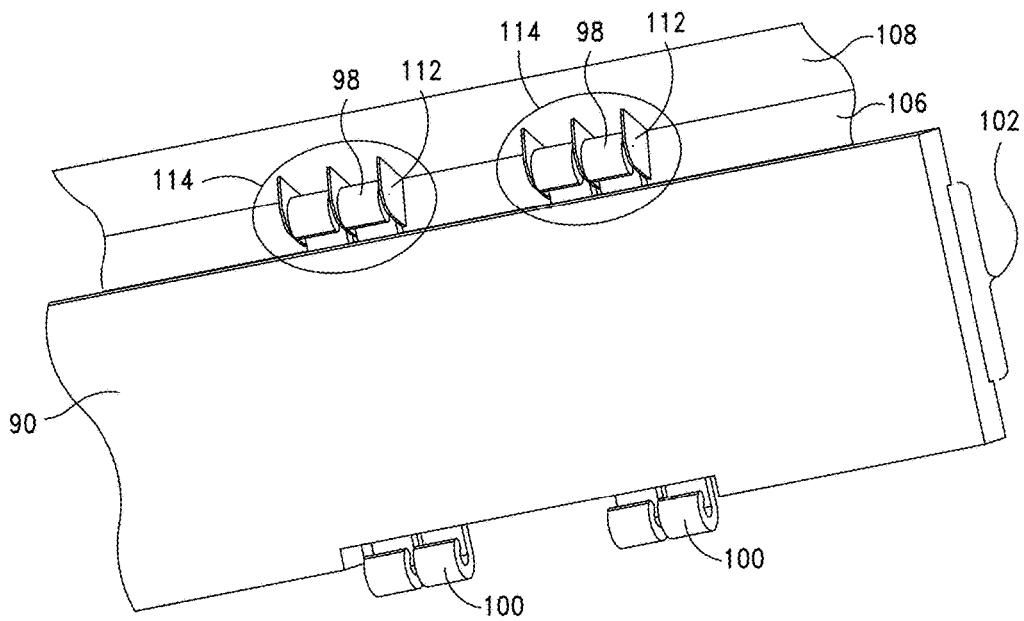

FIG. 14C shows the deflector of FIG. 14A attached to the mount frame of FIG. 14C at rotatable deflector and mount frame attachment 114. Rotatable deflector and mount frame attachment 114 is formed of attached mount frame attachment rods 110 and deflector top hooks 98 thus forming a pivot around which deflector 90 rotates back and forth between a nesting position (deflector nesting position shown in FIG. 14C) and an installation position (deflector installation position shown in FIG. 14D). In other words deflector 90 pivots around rotatable deflector and mount frame attachment 114. FIG. 14C shows deflector 90 in nesting position and positioned against internal ledge 108. FIG. 14D shows deflector 90 in installation position and positioned against flared side wall 106. In installation position, as deflector 70 is positioned against flared side wall 106, deflector 70 aligns with the angle of the flare of flared side wall 106.

Well positioned snapping or locking attachments may help hold or lock the deflector and mounting feet in nesting position. For the installation position, the mount feet align with the mounting surface.

Figure 15A:
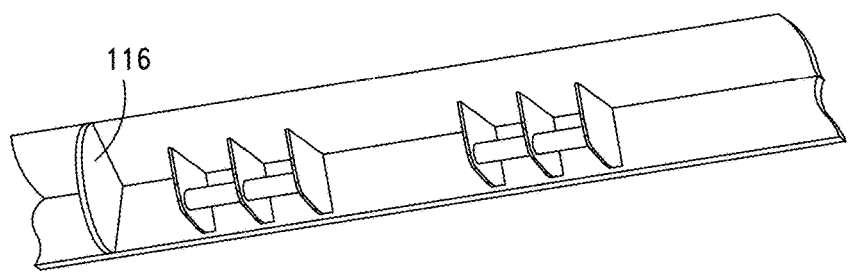
FIGS. 15A and 15B show the structures of FIGS. 14B and 14D, respectively, with an additional guiding rib.
Figure 15B:
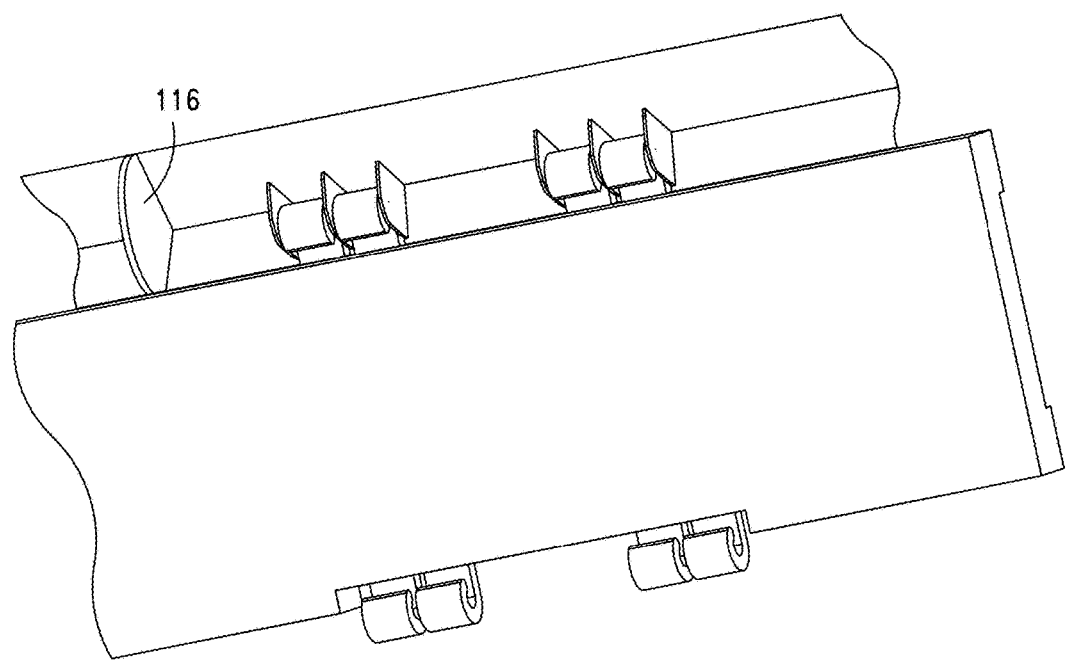

FIGS. 15A and 15B show the structures of FIGS. 14B and 14D, respectively, with additional guiding rib 116 to help deflector 70 snap or lock into nesting and installation positions. Guiding ribs such as guiding rib 116 may be particularly advantageous to snap or lock the deflector into installation position or otherwise signify the deflector is in installation position.

Figure 16B:
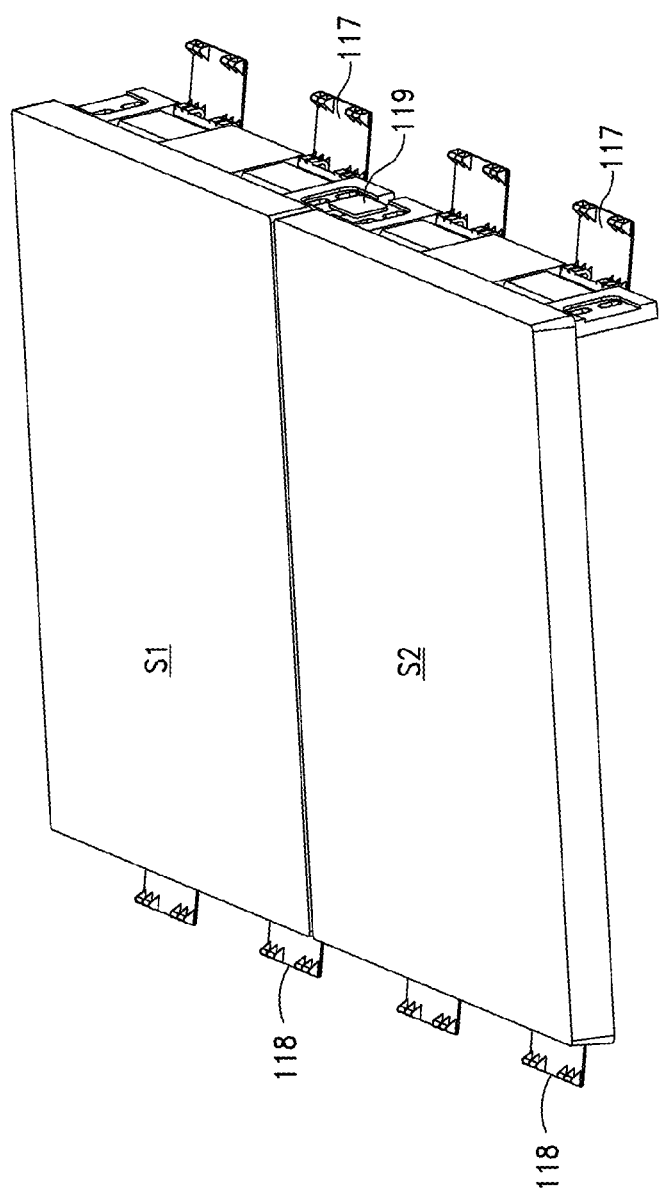
Figure 16C:
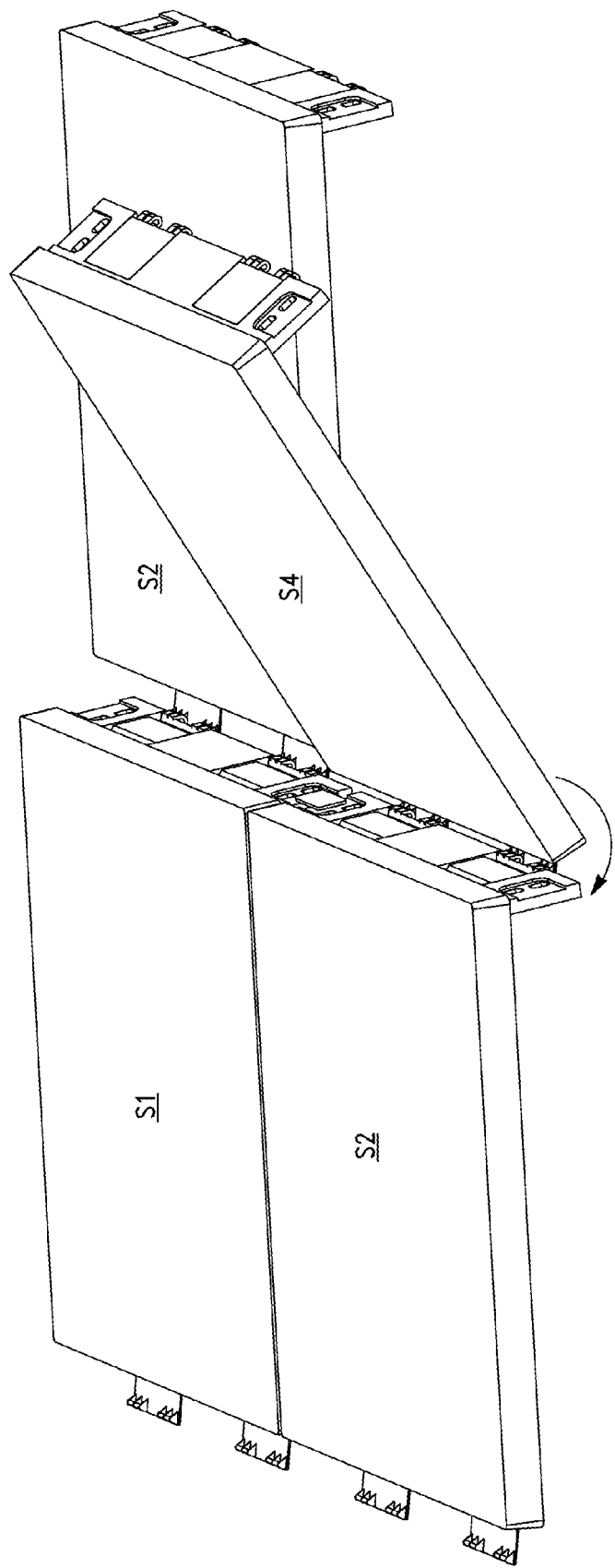

FIGS. 16A through 16C are side perspective views of steps in the installation of a 2×2 array of PV systems in accordance with the disclosed subject matter. FIG. 16A shows PV system S1 with deflector in installation position and rear mounting feet 117 nested in the deflectors of S1 and S2. Front attachment hooks 116, for example attachment hooks such as those shown in FIG. 1, are attached to the front of the mount frames of PV systems S1 and S2. PV system S2 is being set down next to PV system S1. In some instances, a temporary spacer such as a piece of wood (e.g., a 2" by 4" piece of lumber) may be used to position adjacent systems side by side next to each other in rows. FIG. 16B shows the first row of the array formed of PV systems S1 and S2. Rear mounting feet 117 have been rotated out of nesting position to installation position and adhered to a mounting surface. Front mounting feet 118, for example having the rod structure of the mount foot attachment rods on the mount foot shown in FIGS. 9A through 9C, have been hooked and swung onto front attachment hooks 116 of PV systems S1 and S2 (i.e., front mounting feet 118 hooked onto front attachment hooks 116 and then front mounting feet 118 swung into installation position for adhesion to the mounting surface) and then adhered to the mounting surface. Side connector 119 attaches and interlocks the deflector of PV system S1 to PV system S2. Side connector 119 may be used to align the spacing between side by side PV systems forming rows before the PV systems are secured to the mounting surface via adhered mount feet. FIG. 16C shows the second row of the array being installed. PV systems S3 and S4 form the second row of the array and are structurally consistent with PV systems S1 and S2. PV systems S3 and S4 are shown with rear mounting feet nested in the deflectors of PV systems S3 and S4. PV system S3 is shown after the front attachment hooks of PV system S3 have been hooked and swung onto the rear mounting feet of PV system S1 (i.e., front attachment hooks of PV system S3 hooked onto mount foot attachment rods of the already mounting surface adhered rear mounting feet of PV system S1 and then PV system S3 swung into installation position for adhesion to the mounting surface). FIG. 16C shows the front attachment hooks of PV system S4 being hooked into the mount foot attachment rods of the already mounting surface adhered rear mounting feet of PV system S2. Thus, the attachment of the front attachment hooks (shown as a hook and swing attachment, the arrow of FIG. 16C indicating the direction of the hook as the PV system is lowered into an installation position) to a mounting surface adhered mount foot provides self-alignment and interlocking of the column of PV systems (e.g., the column of PV systems S2 and S4 or the column of PV systems S1 and S3).

A detailed installation process may include the following steps: Snap two parallel chalk lines 49 inches apart at leading edge of front row of modules (or alternatively snap one chalk line, for example a line snapped in alignment with the lower edge of the deflector); Apply first PV system on one end of first row—front edge aligning with first chalk line; Lay first PV system back into installation position, back (rear) deflector swings out for support; Lay second PV system to side of first module, 1.5" gap between PV systems, front edge aligning with first chalk line; Lay second PV system into installation position, back deflector swings out for support; Lay all subsequent PV systems in the first row side by side with 1.5" gap between PV systems; Lay all first row PV systems into installation position, back deflector swings out for support; With all first row PV systems placed into position, prepare with cleaner/primer the roof surface adjacent to each rear foot retained in nesting position in the deflector (e.g., two per PV system); Allow cleaner/primer to dry/cure; Pull release liner off each foot, swing each foot down to apply adhesive to cleaned roof area, set each rear foot down to alignment with rear chalk line (#2); After completion of all rear feet attachment to roof, apply cleaner/primer adjacent to front feet mount area for first row; Allow cleaner/primer to dry/cure; Set front feet onto front hooks (two per module) for each front row module; Pull release liner off each foot, swing each foot down to apply adhesive to cleaned roof area, set each front foot down to alignment with front chalk line (#1); Engage each East/West mechanical connection (i.e., a side by side connector, such as side connector 119 in FIG. 16B, in an East/West aligned array) from module to module in first course. Importantly, it is advantageous to establish the cable connection and the engagement of the East/West mechanical connection before the feet are adhered to the surface; Connect male-to-female electrical connectors in adjacent PV systems in first row; With first row fully installed, place home run cable in cable tray on top edge of PV systems running from PV system to consecutive PV system left to right or right to left; Place first PV system of second row in position behind first PV system of second row; Engage (hook and swing) front hooks of first PV system of second row into receptacles on rear foot of first PV system in first row; Lay first PV system of second row of PV systems into installation position, back deflector swings out for support; Engage (hook and swing) front hooks of second PV system of second row into receptacles on rear foot of second PV system in first row; Lay second module of second course of modules into installation position, back deflector swings out for support; Engage (hook and swing) front hooks of all subsequent PV systems in the second row into receptacles on rear foot of each corresponding PV system of the first row. Lay each subsequent module into position; With all of second row PV systems placed into position clean/primer each roof area adjacent to the rear foot of the second row; Allow cleaner/primer to dry/cure; Pull release liner off each rear foot of second row, swing each foot down to apply adhesive to cleaned roof area, set each rear foot down; Engage each East/West mechanical connection (i.e., a side by side connector, such as side connector 119 in FIG. 16B, in an East/West aligned array) from PV system to PV system in second row; Connect male-to-female electrical connectors in adjacent PV systems in second row; With second row fully installed, place home run cable in cable tray on top edge of PV systems running from PV system to consecutive PV system left to right or right to left; Repeat placement of third row and subsequent rows of PV systems as noted above.

Figure 17:
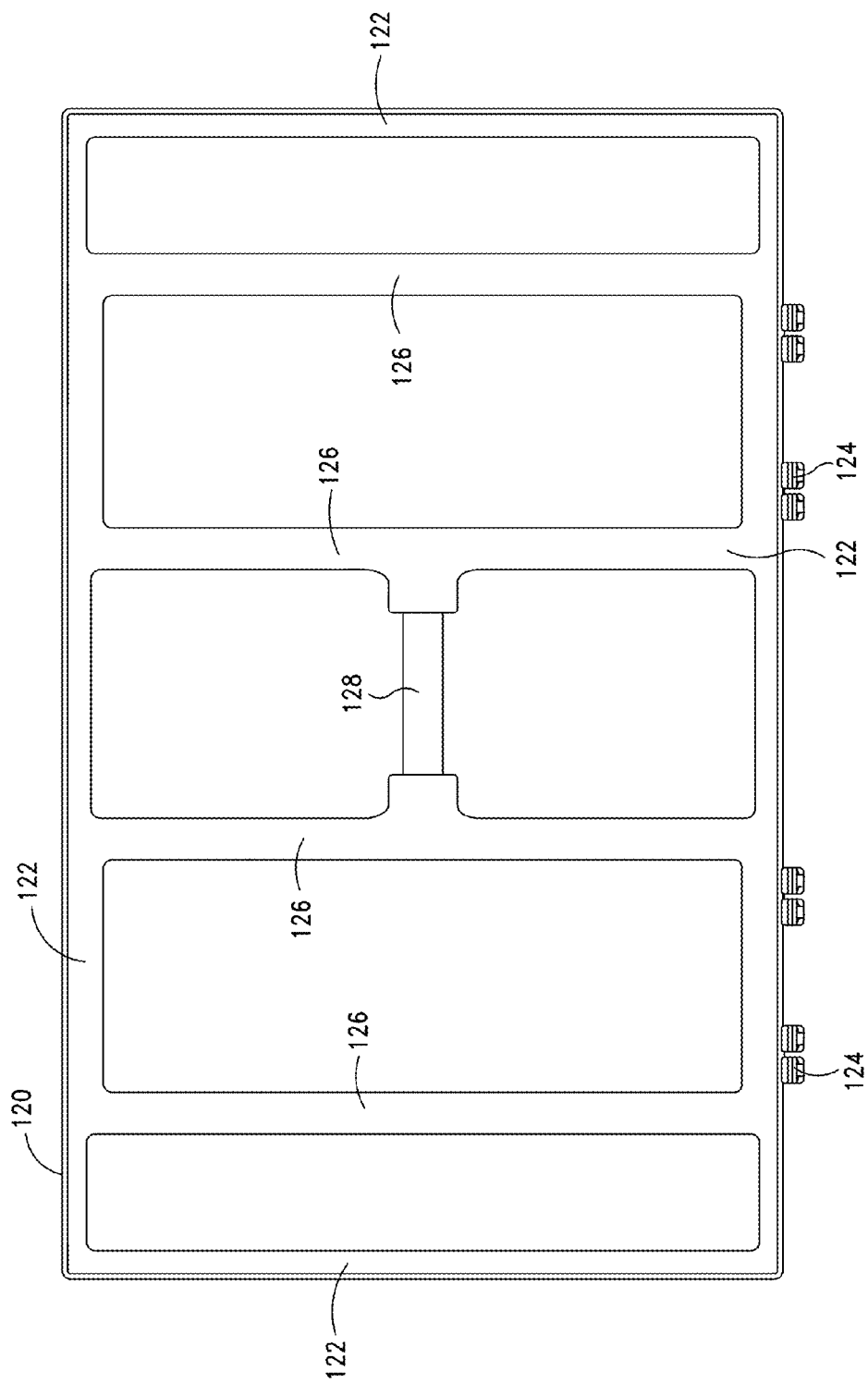
FIG. 17 is a top view of a mount frame without an attached PV module.

FIG. 17 is a top view of a mount frame without an attached PV module. Sidewall 120 is flared from top to bottom (i.e., having a smaller rectangular perimeter at the top frame opening as compared to the perimeter of the bottom frame opening). Internal ledge 122 is attached to and runs around the internal perimeter of sidewall 120. Support structures under internal ledge 122 may provide structure support and stiffening to internal ledge 122—for example guiding rib 116 of FIGS. 15A and 15B may also provide support and stiffening to internal ledge 108. Support ribs 126 and internal ledge 122 may be used as a surface for module attachment as well as for mount stiffening and structural support. Handle 128 provides a handle to carry the PV system (with and without an attached PV module) from the backside. Front attachment hooks 124 are positioned on sidewall 120 at the front of the mount frame.

Figure 18:
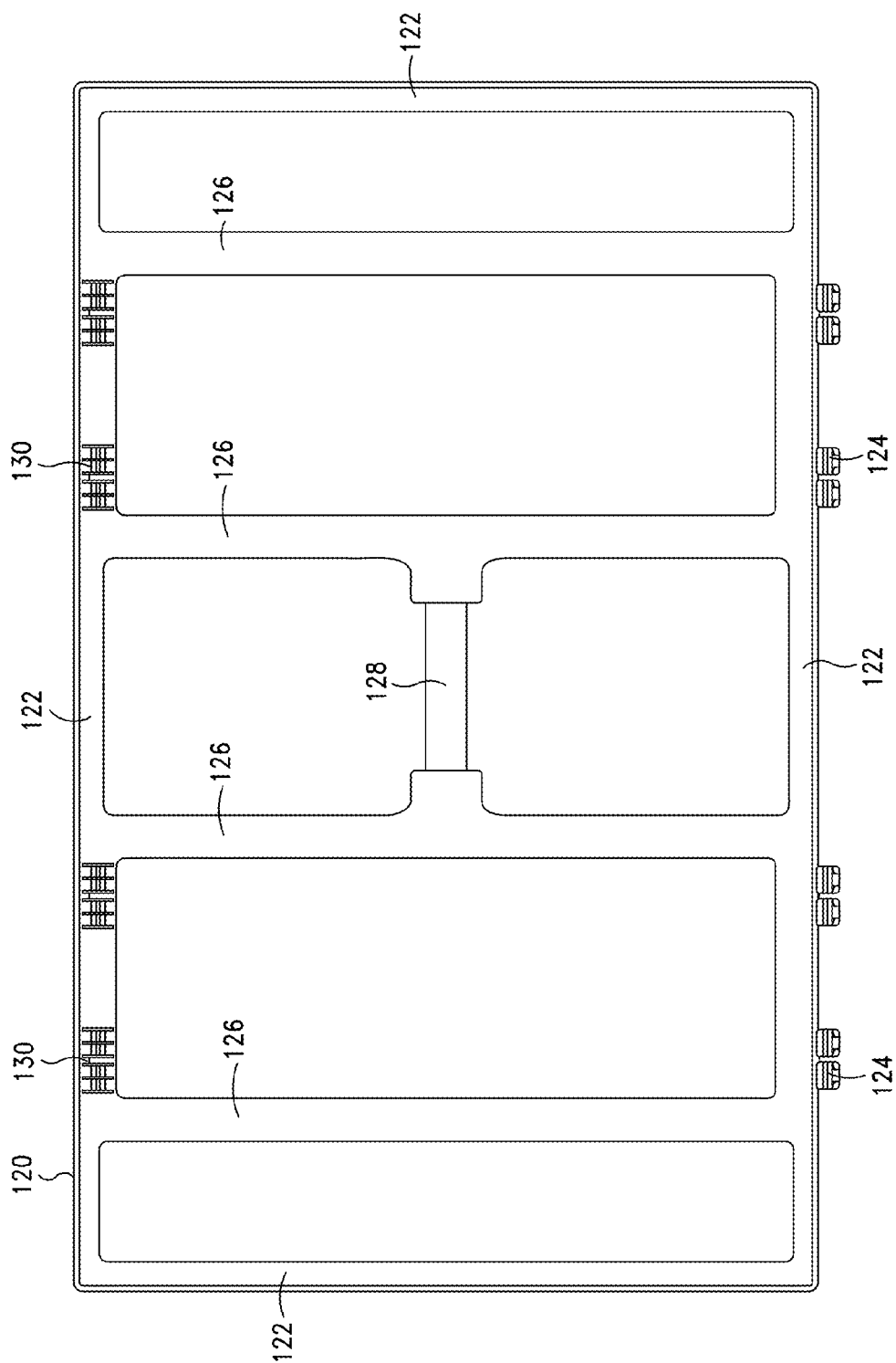
FIG. 18 is a bottom view of a mount frame.

FIG. 18 is a bottom view of the mount frame of FIG. 17. Mount frame and deflector attachment 130 (e.g., a rotatable attachment design similar to mount frame attachment rods 110 and attachment rod support ribs 112 of FIG. 14B) provides a mount frame to deflector attachment.

Figure 19:
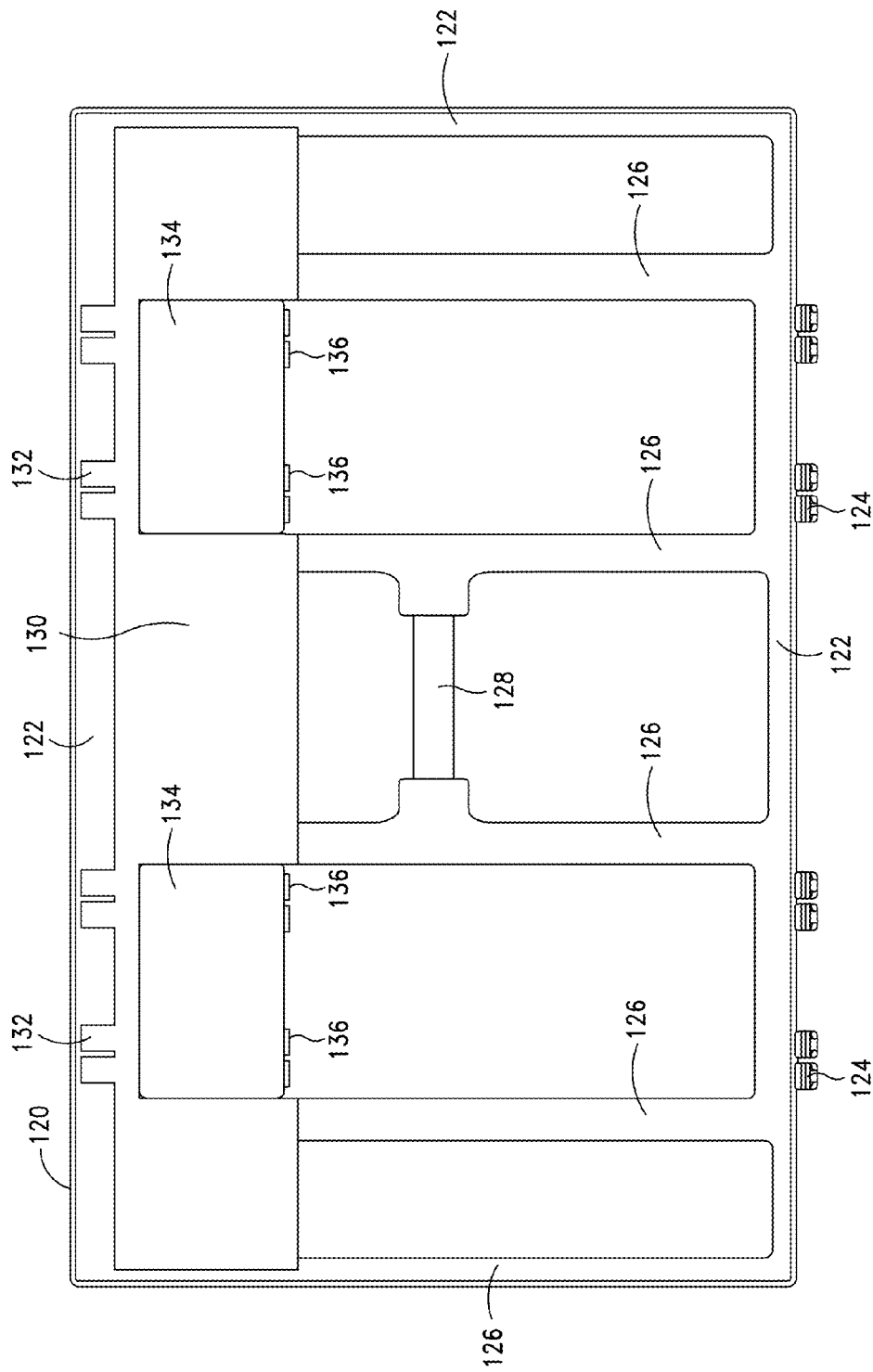
FIG. 19 is a bottom view of the mount frame of FIG. 18 and showing a nested deflector.

FIG. 19 is a bottom view of the mount frame of FIG. 18 and showing a deflector nested in the mount frame. Top deflector attachments 138 of deflector 132 (e.g., a rotatable attachment design similar to deflector top hooks 98 of FIG. 14A) are attached to deflector attachment 130—thus forming a rotatable attachment about which deflector 132 may pivot. Feet 134 are attached to deflector 132 via mount foot and deflector attachment 136 (e.g., a rotatable attachment design similar to rotatable deflector and mount attachment 82 of FIGS. 9B and 9C). Feet 134 are shown in nesting position nested in deflector 132.

Figure 20:
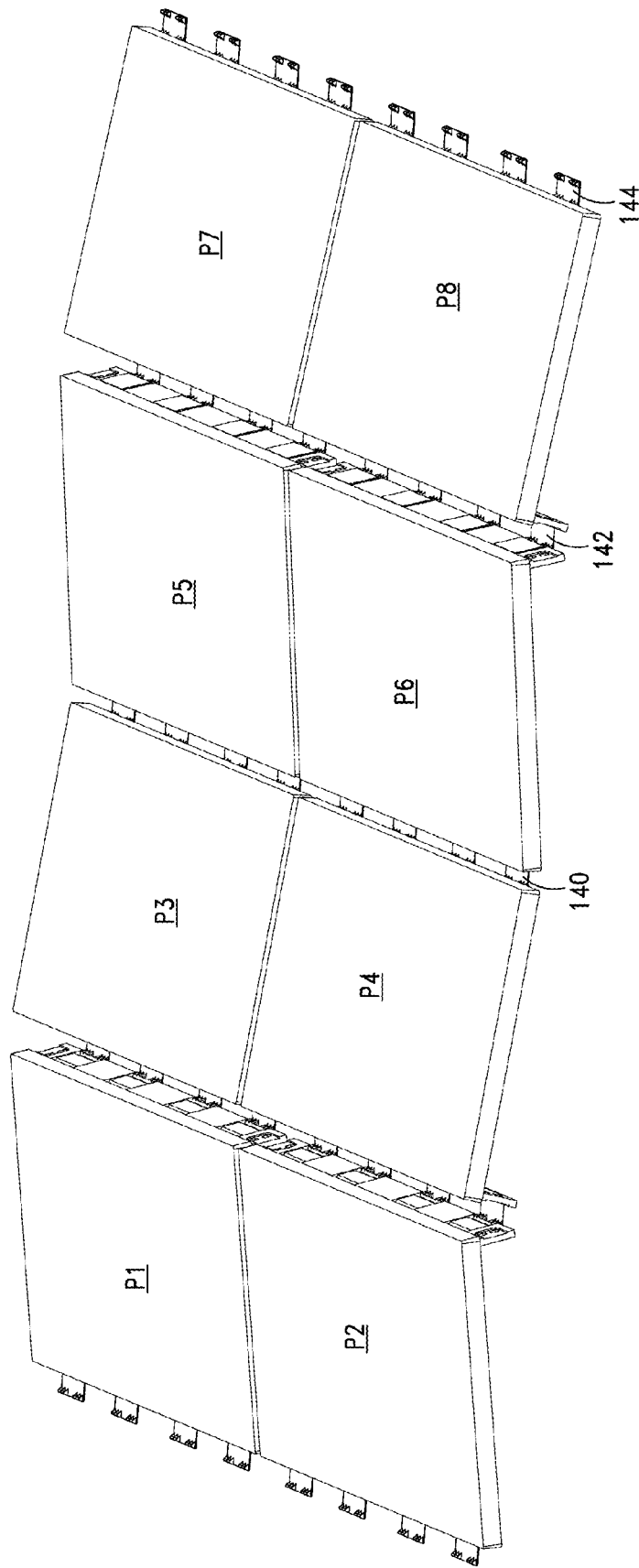
FIG. 20 is a perspective view of an alternative PV system installation.

FIG. 20 is a perspective view of an alternative PV system installation design in accordance with the disclosed subject matter. This design may be referred to as an east west PV system array as compared to the array shown in FIGS. 3 through 6 and 16A through 16C which is referred to as a north south PV system array. The array of FIG. 20 is formed of four rows of PV systems (row 1=P1-P2, row 2=P3-P4, row 3=P5-P6, row 4=P7-P8) and two columns of PV systems (column 1=P1-P3-P5-P7, column 2=P2-P4-P6-P8). Front feet 140 are attached to the front attachments on the front sides of the PV systems of row 2 and row 3. Rear (back) feet 142 are attached to deflectors on the rear (back) sides PV systems of row 3 and row 4. And front feet 144 are attached to the front attachments on the front sides of the PV systems of row 4. Note in this design there are four front mounts and four rear mounts corresponding to each PV system.

Figure 21:
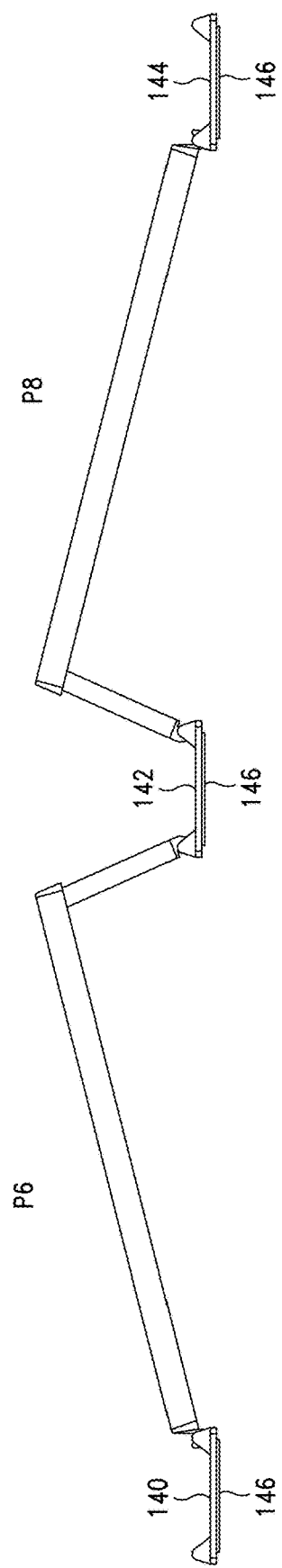
FIG. 21 is side view of the PV systems of FIG. 20.

FIG. 21 is side view of the PV systems of FIG. 20, specifically FIG. 21 is a side view of the PV systems P6 and P8. Adhesion layer 146 is on the bottom of feet 140, 142, and 144 to adhere the feet to a mounting surface.

Figure 22:
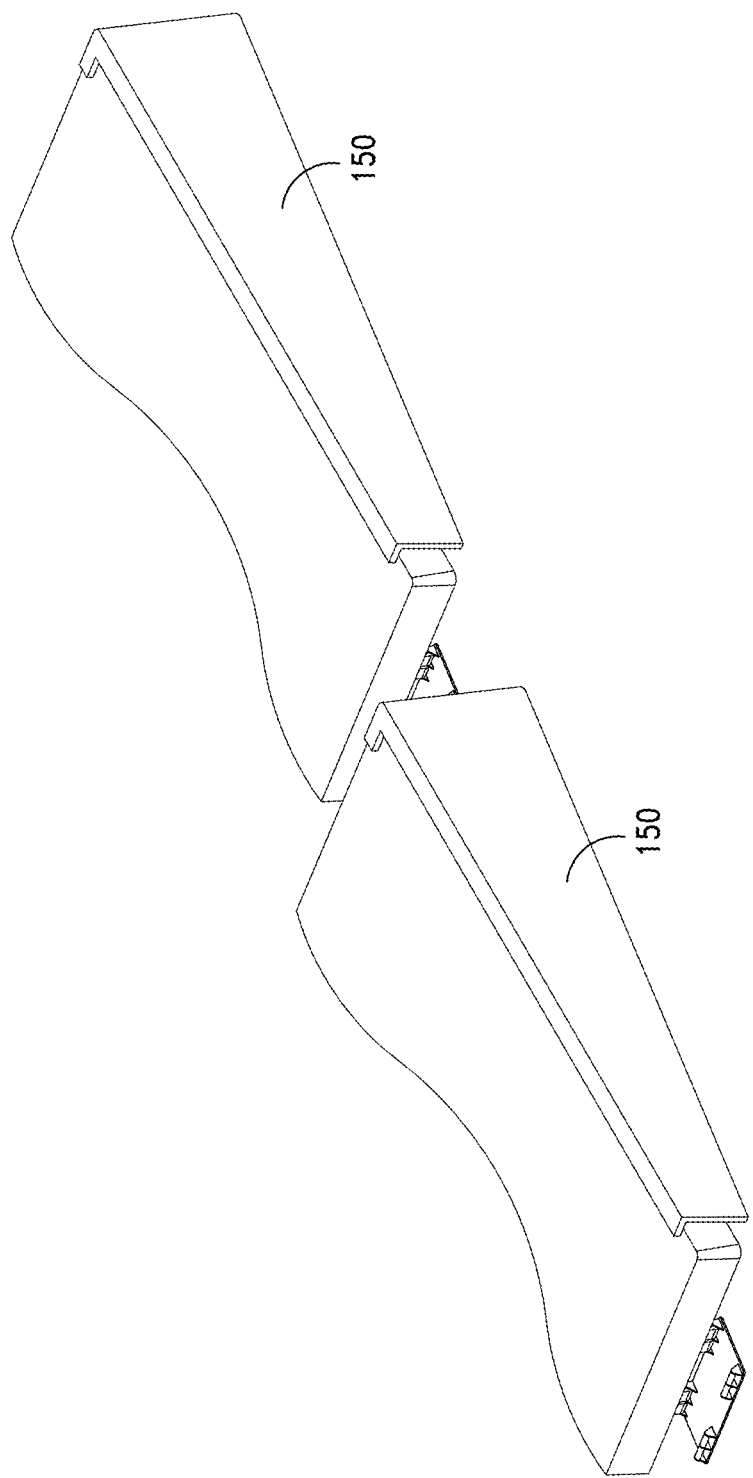
FIG. 22 is a front perspective view a column of PV systems.

FIG. 22 is a front perspective view a column of PV systems in a north south PV system array with a side deflector. Side deflector 150 may be attached to PV systems at the end of a row to further improve wind resistance.

FIGS. 23A and 23B are front perspective views of a two PV systems in a row (side by side) and showing an alternative side by side (east-west) connector design. Swing attachment 164 on mount frame 160 of a first PV system for self-alignment and interlocking with swing attachment snap 166 on mount frame 162 of a second PV system. FIG. 23A shows swing attachment 164 unattached to swing attachment snap 166 and FIG. 23B shows swing attachment 164 attached to swing attachment snap 166.

High strength and water tight attachment and adhesion to known roofing materials (e.g., with reference to flat commercial roofs, thermoplastic roof membranes such as polyvinyl chloride PVC, PVC alloys or compounded thermoplastics, thermoplastic olefin TPO, chlorinated polyethylene CPE, or asphalt/bitumen) are key characteristics of the foot to mounting surface adhesion. Advantageously, foot to mounting surface adhesion may be performed by a double sided adhesive tape such that the tape is attached to the foot before shipping the PV system. Butyl adhesive tapes particularly may provide high strength and water tight attachment of foot to mounting surface. Preparation of the mounting surface prior to application of the foot attached adhesive tape may improve adhesion. Alternative foot to mounting surface adhesion systems include an inductively heated thermoplastic that may be combined with adhesive layers or an injected two part reactive adhesive injection through the foot to the mounting surface. In yet another embodiment, a multi-part adhesion system may be used to first bond a plate to the bottom of the foot based on the foot material and then adhere the plate to the mounting surface (e.g., roofing material) based on the mounting surface (e.g., roof material).

In addition to the lightweight materials for the PV module mount system outlined above, for example outdoor grade plastics and fiber-reinforced composite materials, the following materials and material characteristics are provided. Fiber-reinforced composite material may be used for the integrated module support and mounting sub-structure may be made using glass fibers, aramid fibers, carbon fibers, or a combination thereof. Lower cost options such as glass fibers for glass-fiber-reinforced plastics (glass FRP) may be advantageous. The composite material (FRP) sub-structure should have sufficient thickness and/or strengthening elements (such as ribs and/or lips, etc.) to further enhance mechanical strength and to reduce warpage/bow upon mechanical load while meeting the lightweight requirements (in some instances with the total weight of the module and its integrated support and mounting sub-structure being less than approximately 2 lb/ft$^2$ or less than approximately 10 kg/m$^2$). The fiber-reinforced composite support and mounting material sub-structure (e.g., the PV mount system) may either directly serve as the PV module laminated back-sheet or attach to the module back-sheet.

As noted above, weight characteristics of the PV system may be further enhanced with PV module materials. The following materials and material characteristics are provided. Solar photovoltaic module laminate comprising a lighter weight thin frontside cover glass (e.g., with tempered cover glass thickness of less than or equal to 2.5 mm, and even more advantageously a glass thickness in the range of approximately 0.05 mm to approximately 2 mm, depending on the application and maximum weight allowance) and a composite material (such as a suitable fiber-reinforced plastic: FRP) mounting and support structure opposite the cover glass side, with a plurality of crystalline silicon solar cells, electrically connected in series or a combination of hybrid series-parallel, sandwiched and laminated between the cover glass and the composite plastic support structure.

The PV system provides for substantially reduced installation time for an array of solar panels and this technical disclosure in part provides a lightweight (e.g., through materials and reduced material use) photovoltaic solar module mount. Technical features include, for example, an integrated foldable high packing density module mount with foldable and nestable deflectors and foldable and nestable adhesive mounting feet for fast module mount installation and surface attachment without surface (e.g., roof) puncture or ballasting. Additionally, technical features include, for example, PV system to PV system mechanical interlocking (north south interlocking and east west interlocking) providing PV system self-alignment and PV system to PV system electrical connection (e.g., side by side connection) and wire/cable management.

The PV module is supported and adhered within the rack mount frame. The rack mount frame may comprise a rectangular outer housing with ribs or a continuous sheet for supporting the solar panel within the outer housing. The rack mount frame has a peripheral attachment (e.g., hooks) on the rack mount frame side closest to the ground for attaching to a feet having an attachment (e.g., mounting feet rod structure) on the forward adjacent PV system mounting feet—for example, this attachment may be used for the front to back attachment in a "north-south" PV array to mounting system attachment.

The nestable and movable deflectors may be attached to mount rack frame for example by a rotating hinge or a hook and rod system for rotation from a shipping/nested position such that the deflector snaps into place within the mount rack frame (such that the deflector is parallel to the rack mount frame) and the deflector may be rotated outwards from the mount frame into an installation position (such that deflector is in the range of perpendicular to the rack mount frame) for supporting one side of the rack mount frame off the ground to angle the PV module supported in the rack mount frame off the ground (for example one side of the panel angled in the range of 3 to 30° off the ground and more typically in the range of 10 to 20° as compared to the horizontal plane of the surface, for example a roof). When the deflector is nested the rack mount frame with an adhered PV module, the PV system may be stacked with other PV systems having adhered PV modules for high density shipping.

The mounting feet (e.g., comprising mounting feet rod structure for on two sides, on one side for attachment to the deflector of a corresponding PV system and on the other side for attachment to an adjacent PV system via the adjacent PV system's peripheral hooks or other attachment mechanism) are attached to the nestable and movable deflectors for example by a rotating hinge or a hook and rod system for rotation from a shipping/nested position such that the mounting feet snap into place within the deflector frame (for example in indentions in the deflector accommodating the mounting feet rod structure, the mounting feet rod structure for attaching to a hook attached to a rack mount frame in an adjacent PV system) and the mounting feet may be rotated from the mount frame into an installation position for adhesion to the ground or a surface.

Thus in a shipped position the mounting feet nest and snap into the deflector and the deflector nests and snaps into the rack mount frame. In an installation position the deflector may be rotated outwards from the rack mount frame into a snapped installation position to support one side of the rack mount frame and the feet are rotated outwards from the deflector to adhere the PV system to the ground or a surface. The PV system is now installed (adhered and secured). The next PV system (e.g., via hooks on its peripheral rack mount) may then be attached to the exposed rod structure of the just adhered mounting feet. Thus securing the lower side of this next PV system to the installed PV system (and a "north-south" PV system to PV system attachment) and the process may repeat itself as the deflector on the next PV system may be rotated into an installation position and so forth.

Pertaining to side by side interlocking attachment, or also called "east-west" attachment, a nestable east west (side) connector may be attached to the deflector or the mount frame. For example, the east west connector may be nested into the deflector during shipping (similar to the mounting feet), and rotated outwards for connection to an adjacent side by side ("east-west") PV system during installation for securing the array of PV systems in the east-west direction. Thus, forming a secured array of PV systems attached to the ground via the mounting feet, attached to one another from front to back ("north-south") via the peripheral hooks on the low end of the mount rack frame and the rod structure on the mounting feet, and attached to one another side by side ("east-west") via the east west connector which secures the PV system to an adjacent (east west adjacent) PV system.

The foregoing description of the exemplary embodiments is provided to enable any person skilled in the art to make or use the claimed subject matter. Various modifications to these embodiments will be readily apparent to those skilled in the art, and the generic principles defined herein may be applied to other embodiments without the use of the innovative faculty. Thus, the claimed subject matter is not intended to be limited to the embodiments shown herein but is to be accorded the widest scope consistent with the principles and novel features disclosed herein.

What is claimed is:

1. A photovoltaic system, comprising:
    a photovoltaic module attached to a photovoltaic mount frame, said mount frame having a rectangular shape;
    a deflector attached to said mount frame by a rotatable deflector and mount frame attachment wherein said deflector pivots around said rotatable deflector and mount frame attachment from a nesting position under said photovoltaic module in said mount frame to an installation position raising at least a first side of said mount frame; and
    a mount foot attached to said deflector by a rotatable mount foot and deflector attachment wherein said mount foot pivots around said rotatable mount foot and deflector attachment from a nesting position in a mount foot nesting indention in said deflector to an installation position planar to a mounting surface.

2. The photovoltaic system of claim 1, wherein said mount frame further comprises a flared mount frame side wall forming a first side of said mount frame, said flared mount frame side wall flared from top to bottom, and said deflector is attached on said first side of said mount frame.

3. The photovoltaic system of claim 1, wherein said mount frame, said deflector, and said mount foot are made of plastic composite.

4. The photovoltaic system of claim 1, wherein said mount frame further comprises an internal ledge for photovoltaic module support.

5. The photovoltaic system of claim 1, wherein said mount frame further comprises internal ribs for photovoltaic module support.

6. The photovoltaic system of claim 1, wherein said mount frame, said deflector, and said mount foot are made of fiber reinforced plastic.

7. A photovoltaic system, comprising:
a photovoltaic module attached to a photovoltaic mount frame, said mount frame having a rectangular shape, said mount frame having an attachment hook on at least a first side of said rectangular shape of said mount frame;
a deflector attached to a second side of said rectangular shape of said mount frame, said deflector raising at least said second side of said mount frame, said second side of said mount frame opposite said first side of said mount frame;
said second side of said mount frame having a flared mount frame side wall, said flared mount frame side wall flared from top to bottom;
a deflector foot adhered to a mounting surface and attached to said deflector mount foot by a deflector to deflector foot attachment; and
a mount frame foot adhered to a mounting surface and attached to said mount frame attachment hook by a hook and swing attachment.

8. The photovoltaic system of claim 7, wherein said mount frame, said deflector, and said mount foot are made of fiber reinforced plastic.

9. A photovoltaic system installation, comprising:
an installation of photovoltaic systems formed of at least a column of photovoltaic systems, said column of photovoltaic systems formed of at least a first photovoltaic system adjacent to a second photovoltaic system;
said first photovoltaic system and said second photovoltaic system each having a photovoltaic module attached to a corresponding photovoltaic mount system;
each of said photovoltaic mount systems having a photovoltaic mount frame and a deflector, said mount frame having a rectangular shape, said photovoltaic module of said photovoltaic system attached to said mount frame, said mount frame having an attachment hook on at least a first side of said rectangular shape of said mount frame, and said deflector attached to said mount frame and raising at least a second side of said rectangular shape of said mount frame, said second side of said mount frame opposite said first side of said mount frame;
a first foot adhered to a mounting surface and attached to an attachment hook of said first photovoltaic system by a first hook and swing attachment;
a second foot adhered to a mounting surface, said second foot attached to said deflector of said first photovoltaic system and to attached to said to an attachment hook of said second photovoltaic system by a second hook and swing attachment; and
a third foot adhered to a mounting surface, said third foot attached to said deflector of said second photovoltaic system;
wherein said attachment hooks of said mount frames, said first hook and swing attachment, and said second hook and swing attachment are self-aligning to form the column alignment of said first photovoltaic system and said second photovoltaic system.

10. The photovoltaic system installation of claim 9, wherein said installation of photovoltaic systems further comprises a row of photovoltaic systems formed of at least said first photovoltaic systems and a third photovoltaic system, and said deflector of said first photovoltaic system attached to said deflector of said third photovoltaic system.

11. The photovoltaic system installation of claim 9, wherein said mount frames of said photovoltaic mount systems further comprise a flared mount frame side wall forming said second side of said mount frame, said flared mount frame side wall flared from top to bottom, and said deflector attached inside said flared mount frame side wall.

12. The photovoltaic system of claim 9, wherein said photovoltaic mount system is made of fiber reinforced plastic.

* * * * *